United States Patent [19]

Kishida et al.

[11] Patent Number: 5,631,841
[45] Date of Patent: May 20, 1997

[54] CIRCUIT CONNECTION INFORMATION GENERATION THROUGH CIRCUIT ANALYSIS AND COMPONENT REPLACEMENT

[75] Inventors: Satoru Kishida, Takarazuka; Yasunori Shibayama, Amagasaki, both of Japan

[73] Assignee: Mitsubishi Denki Kabushiki Kaisha, Tokyo, Japan

[21] Appl. No.: 392,352

[22] Filed: Feb. 22, 1995

[30] Foreign Application Priority Data

Mar. 23, 1994 [JP] Japan .................................. 6-051841

[51] Int. Cl.$^6$ .................................................. H05K 7/02
[52] U.S. Cl. .................................................. 364/488
[58] Field of Search .................................. 364/488, 489, 364/490, 491

[56] References Cited

U.S. PATENT DOCUMENTS

| | | |
|---|---|---|
| 5,249,133 | 9/1993 | Batra . |
| 5,278,769 | 1/1994 | Bair et al. .............................. 364/490 |
| 5,463,563 | 10/1995 | Bair et al. .............................. 364/490 |
| 5,469,366 | 11/1995 | Yang et al. .............................. 364/489 |

OTHER PUBLICATIONS

IEEE Transactions on Computer–Aided Design, vol. 11, No. 6, pp. 732–738, Jun. 1992, Terrence B. Hook, "Automatic Extraction of Circuit Models from Layout Artwork for a BiCMOS Technology".

An Interactive Layout Design System with Real–Time Logical Verification and Extraction of Layout Parasitics, IEEE 1988.

Detailed Extraction of Distributed Networks and Parasitics in IC Designs IEEE, 1992.

*Primary Examiner*—Kevin J. Teska
*Assistant Examiner*—Dan Fiul
*Attorney, Agent, or Firm*—Oblon, Spivak, McClelland, Maier & Neustadt, P.C.

[57] ABSTRACT

A circuit connection information generating device for generating circuit connection information which correctly reflects circuit connection information provided from a circuit drawing and which contains parasitic elements is disclosed. A node/element name converting means (4) replaces the name of a component to be converted which is specified by first circuit connection information (D11) with the name of an element and node specified by second circuit connection information on the basis of a corresponding relation of the component to be converted when the corresponding relation is indicated in a node/element name correspondence table (D1) and replaces the name of the component to be converted with a name sequentially given from an unused name list (NL) when the corresponding relation is not indicated in the node/element name correspondence table (D1), to provide third circuit connection information (D13) on the basis of the node/element name correspondence table (D1), the first circuit connection information (D11), and the unused name list (NL).

17 Claims, 25 Drawing Sheets

FIG. 14

```
MP01  N2  N1  V10  V10  PMOS  1u  10u
MN01  N2  N1  V0   V0   NMOS  1u  10u
MP02  N3  N2  V10  V10  PMOS  1u  10u
MN02  N3  N2  V0   V0   PMOS  1u  10u
C0001 N2  V0  1p
```
— D11

FIG. 17

```
M0001 N101 N102 V200 V200 PMOS 1u 10u 50p 50p 20u 20u 0.2 0.2
M0002 N103 N101 V200 V200 PMOS 1u 10u 50p 50p 20u 20u 0.2 0.2
M0003 N101 N102 V100 V100 NMOS 1u 10u 50p 50p 20u 20u 0.2 0.2
M0004 N103 N101 V100 V100 NMOS 1u 10u 50p 50p 20u 20u 0.2 0.2
C0001 N102 V100 0.1p
C0002 N101 V100 1.1p
C0003 N101 V100 0.2p
C0004 N103 V100 0.1p
```

D11

TRANSISTOR TYPE — TRANSISTOR SIZE — CONFIGURATION OF SOURCE/DRAIN

```
MP01 N2 N1 V10 V10 PMOS 1u 10u 50p 50p 20u 20u
MP02 N3 N2 V10 V10 PMOS 1u 10u 50p 50p 20u 20u
MN01 N2 N1 V0  V0  NMOS 1u 10u 50p 50p 20u 20u
MN02 N3 N2 V0  V0  NMOS 1u 10u 50p 50p 20u 20u
CC001  N1  V0  0.1p
C0001  N2  V0  1.1p
CC002  N2  V0  0.2p
CC003  N3  V0  0.1p
```
— D13

```
                                                         D5
N12    MP01-Drain, MN01Drain;N12-1   R01   1Ω
N12    N12-1;MP02-Gate               R02   1Ω
N12    N12-1;MN02-Gate               R03   1Ω
```

CIRCUIT CONNECTION INFORMATION GENERATION THROUGH CIRCUIT ANALYSIS AND COMPONENT REPLACEMENT

BACKGROUND OF THE INVENTION

1. Field of the Invention

The present invention relates to a device and a method for generating circuit connection information containing parasitic elements extracted from layout pattern data.

2. Description of the Background Art

FIG. 27 illustrates a first example of the conventional procedure for generating circuit connection information. Referring to FIG. 27, parameter data 302 such as capacitances of capacitors and transistor configurations is outputted from layout pattern data 110 in a parameter extracting process 301. In a manual circuit connection information generating process 303, the contents of the parameter data 302 are processed and first circuit connection information 112 is outputted. Then, a circuit simulation executing process 310 is carried out.

FIG. 28 illustrates a second example of the conventional procedure for generating circuit connection information. Referring to FIG. 28, the parameter data 302 such as capacitances of capacitors and transistor configurations is outputted from the layout pattern data 110 in the parameter extracting process 301. In the manual circuit connection information generating process 303, the contents of the parameter data 302 are processed and the first circuit connection information 112 is outputted.

After a parasitic element selecting process 304 is manually carried out, a manual adding process 305 to a circuit drawing provides a circuit drawing 120 including parasitic elements added to a normal circuit drawing.

Then, second circuit connection information 122 is extracted from the circuit drawing 102 in a circuit connection information extracting process 306, and the circuit simulation executing process 310 is carried out.

In this manner, the first example has extracted the circuit connection information containing the parasitic elements from the layout pattern data and then performed the circuit simulation and the like upon the circuit connection information. The second example has manually added the parasitic elements extracted from the layout pattern data onto the circuit drawing, extracted the circuit connection information containing the parasitic elements from the circuit drawing, and then performed the circuit simulation and the like.

To obtain circuit connection information containing the parasitic elements, the circuit connection information has been directly extracted from the layout pattern data, as in the first example of FIG. 27. However, this circuit connection information has been disadvantageous in that a node at which a waveform is desired to be observed is not specified from the circuit drawing when the circuit simulation is executed on the circuit connection information, causing difficulties in specifying defective portions in the circuit from the result of the circuit simulation.

The addition of the parasitic elements to the circuit drawing has been made inconveniently by hand as in the second example illustrated in FIG. 28, resulting in a prolonged period of design time.

In particular, insertion of the parasitic elements such as resistances in the circuit drawing has required division of one signal line by new nodes, sometimes requiring a great change in the circuit drawing with difficulty.

Further, if a circuit portion includes logically identical but physically different transistor connections between the circuit drawing and the layout pattern data, the parasitic elements extracted from the layout pattern data have not correctly been added directly to the circuit drawing.

SUMMARY OF THE INVENTION

According to the present invention, a circuit connection information generating device comprises: first read means for reading first associated circuit information associated with one of first circuit connection information and second circuit connection information, the first circuit connection information specifying elements and element connections provided from layout pattern data, the second circuit connection information specifying elements and element connections provided from a circuit drawing; second read means for reading second associated circuit information associated with the other of the first circuit connection information and the second circuit connection information; and circuit connection information generating means for adding element information containing parasitic elements and connection information thereof to the second circuit connection information to automatically generate third circuit connection information on the basis of the first associated circuit information and the second associated circuit information.

As above described, the circuit connection information generating means of the circuit connection information generating device of the present invention automatically generates the third circuit connection information which is provided by adding the element information containing the parasitic elements and the connection information thereof to the second circuit connection information on the basis of the first associated circuit information and the second associated circuit information. Thus, the circuit connection information provided from the circuit drawing and containing the parasitic elements is automatically produced.

As a result, only by reading the first associated circuit information and the second associated circuit information, the circuit connection information generating device automatically produces the circuit connection information which correctly reflects the circuit connection information provided from the circuit drawing and contains the parasitic elements.

Preferably, the first circuit connection information and the second circuit connection information contain unique names given to respective constituent elements and respective nodes which are connecting points between the elements; the first associated circuit information is the first circuit connection information; the second associated circuit information is corresponding relation information in which the names of the elements and nodes specified by the second circuit connection information are listed in corresponding relation to the elements and nodes specified by the first circuit connection information; and the circuit connection information generating means includes unused name generating means for generating a group of names unused in the first circuit connection information and the second circuit connection information on the basis of the corresponding relation information, and node and element name converting means receiving the group of unused names, the first circuit connection information, and the corresponding relation information, the node and element name converting means replacing the name of a component to be converted which is each element or node specified by the first circuit connection information with the name of an element or node specified by the second circuit connection information on the basis of a corresponding relation of the component to be converted when the corresponding relation of the component to be converted is indicated in the corresponding relation information, the node and element name converting means replacing the name of the component to be converted with a name sequentially given from the group of unused names when the corresponding relation of the component to be converted is not indicated in the corresponding relation information, the node and element name converting means thereby outputting the third circuit connection information.

In the circuit connection information generating device, the circuit connection information generating means includes the node and element name converting means as above described.

Thus, the circuit connection information generating device reads the first circuit connection information and the corresponding relation information, thereby to automatically add the parasitic elements provided from the first circuit connection information while replacing the contents of the first circuit connection information with the contents of the circuit connection information provided from the circuit drawing.

As a result, only by reading the first circuit connection information and the corresponding relation information, the circuit connection information generating device automatically produces the circuit connection information which correctly reflects the circuit connection information provided from the circuit drawing and contains the parasitic elements.

Preferably, the circuit connection information generating means further includes multiple correspondence associated component extracting means for extracting a multiple correspondence component which is a node or element specified by the second circuit connection information and having a corresponding relation with a plurality of nodes or elements and extracting a selected component which is one of a plurality of components specified by the first circuit connection information and corresponding to the multiple correspondence component to output multiple correspondence associated component information on the basis of the corresponding relation information, and the node and element name converting means receives the group of unused names, the first circuit connection information, the corresponding relation information, and the multiple correspondence associated component information, and replaces the name of a component to be converted which is each element or node specified by the first circuit connection information with the name of an element or node specified by the second circuit connection information on the basis of a corresponding relation of the component to be converted when the following condition 1 is satisfied: the condition 1: either a condition 1A or a condition 1B is satisfied, the condition 1A: the corresponding relation of the component to be converted is indicated in the corresponding relation information but does not contain the multiple correspondence component, the condition 1B: the corresponding relation of the component to be converted is indicated in the corresponding relation information and both the multiple correspondence component and the selected component establish the corresponding relation, and replaces the name of the component to be converted with a name sequentially given from the group of unused names when the condition 1 is not satisfied, to thereby output the third circuit connection information.

If there is no node (element) in the second circuit connection information corresponding to the node (element) in the circuit specified by the first circuit connection information, the node in the circuit specified by the first circuit connection information is correctly reflected on the circuit specified by the second circuit connection information. This provides more correct circuit connection information.

Preferably, the first circuit connection information and the second circuit connection information contain unique names given to respective constituent elements and respective nodes which are connecting points thereof; the first associated circuit information is the first circuit connection information; the second associated circuit information is the second circuit connection information; and the circuit connection information generating means includes circuit information comparing means for comparing the first circuit connection information and the second circuit connection information with each other to generate corresponding relation information in which the names of the elements and nodes specified by the first circuit connection information are listed in corresponding relation to the elements and nodes specified by the second circuit connection information, unused name generating means for generating a group of names unused in the first circuit connection information and the second circuit connection information on the basis of the corresponding relation information, and node and element name converting means receiving the group of unused names, the first circuit connection information, and the corresponding relation information, the node and element name converting means replacing the name of a component to be converted which is each element or node specified by the first circuit connection information with the name of an element or node specified by the second circuit connection information on the basis of a corresponding relation of the component to be converted when the corresponding relation of the component to be converted is indicated in the corresponding relation information, the node and element name converting means replacing the name of the component to be converted with a name sequentially given from the group of unused names when the corresponding relation of the component to be converted is not indicated in the corresponding relation information, the node and element name converting means thereby outputting the third circuit connection information.

In the circuit connection information generating device, the circuit connection information generating means includes the node and element name converting means as above described.

Thus, the circuit connection information generating device reads the first circuit connection information and the second circuit connection information, thereby to automatically add the parasitic elements while replacing the contents of the first circuit connection information with the contents of the second circuit connection information.

As a result, only by reading the first circuit connection information and the second circuit connection information, the circuit connection information generating device automatically produces the circuit connection information which correctly reflects the circuit connection information provided from the circuit drawing and contains the parasitic elements.

Preferably, the circuit connection information generating means further includes multiple correspondence associated component extracting means for extracting a multiple correspondence component which is a node or element specified by the second circuit connection information and having a corresponding relation with a plurality of nodes or elements and extracting a selected component which is one of a plurality of components specified by the first circuit connection information and corresponding to the multiple correspondence component to output multiple correspondence associated component information on the basis of the corresponding relation information, and the node and element name converting means receives the group of unused names, the first circuit connection information, the corresponding relation information, and the multiple correspondence associated component information, and replaces the name of a component to be converted which is each element or node specified by the first circuit connection information with the name of an element or node specified by the second circuit connection information on the basis of a corresponding relation of the component to be converted when the following condition 1 is satisfied: the condition 1: either a condition 1A or a condition 1B is satisfied, the condition 1A: the corresponding relation of the component to be converted is indicated in the corresponding relation information but does not contain the multiple correspondence component, the condition 1B: the corresponding relation of the component to be converted is indicated in the corresponding relation information and both the multiple correspondence component and the selected component establish the corresponding relation, and replaces the name of the component to be converted with a name sequentially given from the group of unused names when the condition 1 is not satisfied, to thereby output the third circuit connection information.

If there is no node (element) in the second circuit connection information corresponding to the node (element) in the circuit specified by the first circuit connection information, the node in the circuit specified by the first circuit connection information is correctly reflected on the circuit specified by the second circuit connection information. This provides more correct circuit connection information.

Preferably, the second circuit connection information contains unique names given to respective constituent elements and respective nodes which are connecting points thereof; the first associated circuit information is parasitic element insertion information in which nodes specified by the second circuit connection information are associated with parasitic elements specified by the first circuit connection information and to be inserted into the nodes; the second associated circuit information is the second circuit connection information; and the circuit connection information generating means includes unused name generating means for generating a group of names unused in the second circuit connection information on the basis of the second circuit connection information, and node and element name converting means for inserting a parasitic element into a node specified by the second circuit connection information while generating a new node, if required to, using a name sequentially given from the group of unused names to add the element information containing the parasitic elements and the connection information thereof to the second circuit connection information, thereby to output the third circuit connection information, on the basis of the group of unused names, the second circuit connection information, and the parasitic element insertion information.

In the circuit connection information generating device, the circuit connection information generating means includes the node and element name converting means as above described.

Thus, the circuit connection information generating device reads the second circuit connection information and the parasitic element insertion information, thereby to automatically add the parasitic elements directly to the second circuit connection information.

In this case, if there is no node in the circuit specified by the second circuit connection information corresponding to the node (element) in the first circuit connection information, the node in the first circuit connection information is correctly reflected on the circuit specified by the second circuit connection information. This provides more correct circuit connection information.

As a result, only by reading the second circuit connection information and the parasitic element insertion information, the circuit connection information generating device automatically produces the circuit connection information which correctly reflects the circuit connection information provided from the circuit drawing and contains the parasitic elements.

It is therefore an object of the present invention to provide a circuit connection information generating device for automatically generating circuit connection information which correctly reflects circuit connection information given from a circuit drawing and contains parasitic elements.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 illustrates an example of second circuit connection information;

FIG. 17 illustrates an example of first circuit connection information;

FIG. 18 illustrates an example of a node/element name correspondence table;

FIG. 19 illustrates an example of third circuit connection information;

DESCRIPTION OF THE PREFERRED EMBODIMENTS

First Preferred Embodiment

Figure 1:
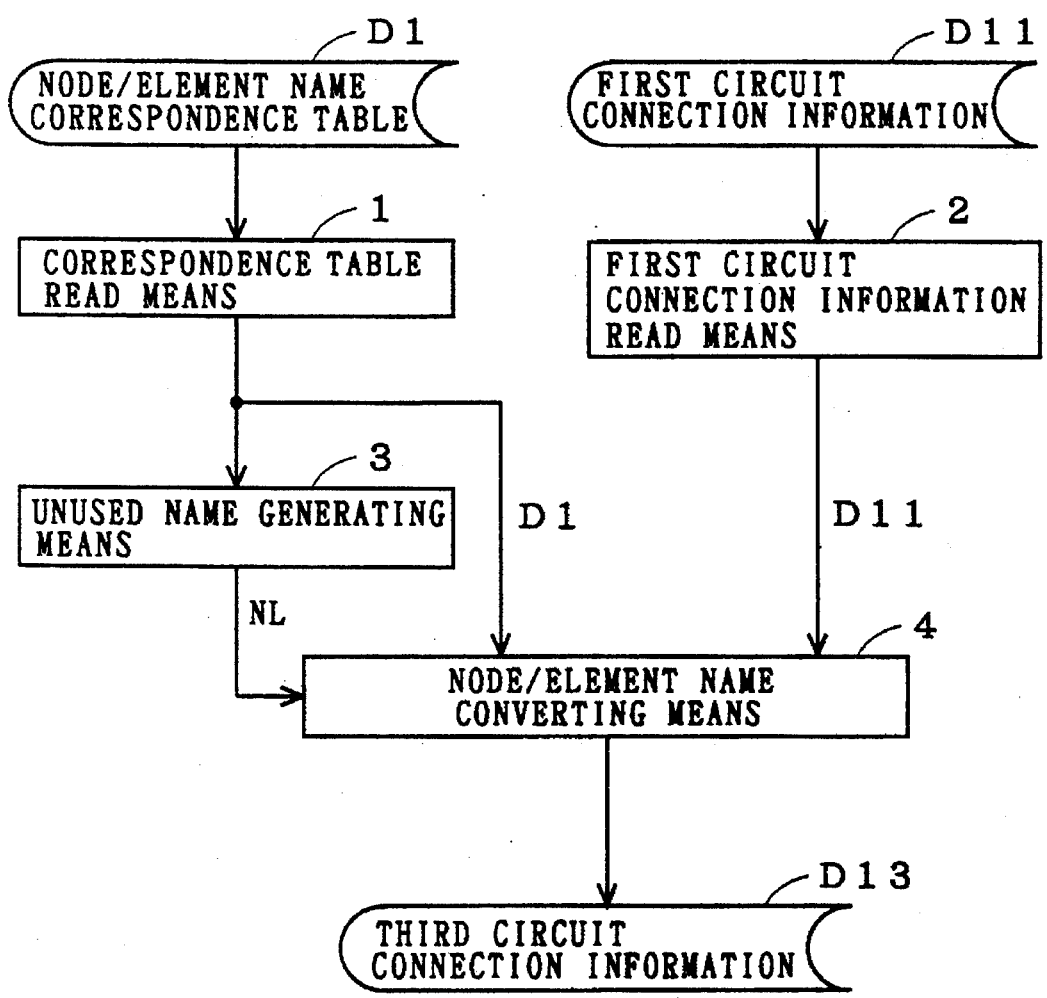
FIG. 1 is a block diagram of a circuit connection information generating device according to a first preferred embodiment of the present invention.

FIG. 1 is a block diagram of a circuit connection information generating device according to a first preferred embodiment of the present invention. Referring to FIG. 1, a correspondence table read means 1 reads a node/element name correspondence table D1, and a first circuit connection information read means 2 reads first circuit connection information D11.

The first circuit connection information D11 specifies elements extracted from layout pattern data and element connections, and contains unique names given to respective elements and respective nodes which are connecting points between the elements. The elements specified by the first circuit connection information D11 include parasitic elements such as parasitic resistances and parasitic capacitances. The first circuit connection information D11 is provided by a first circuit connection information providing means (not shown) on the basis of the layout pattern data of a predetermined semiconductor integrated circuit.

The node/element name correspondence table D1 includes corresponding relation information, in a table form, wherein the names of the elements and nodes specified by second circuit connection information are listed in corresponding relation to the elements and nodes specified by the first circuit connection information D11.

The second circuit connection information specifies elements extracted from a circuit drawing and element connections, and contains unique names given to respective elements and respective nodes which are connecting points between the elements.

The node/element name correspondence table D1 read by the correspondence table read means 1 is received by an unused name generating means 3 and a node/element name converting means 4. The first circuit connection information D11 read by the first circuit connection information read means 2 is received by the node/element name converting means 4.

The unused name generating means 3 outputs an unused name list NL containing names unused in the second circuit connection information to the node/element name converting means 4 on the basis of the node/element name correspondence table D1.

The node/element name converting means 4 performs the processing to be described below on a component to be converted which is each element or node specified by the first circuit connection information D11 on the basis of the node/element name correspondence table D1, the first circuit connection information D11 and the unused name list NL. That is, when the corresponding relation of the component to be converted is indicated in the node/element name correspondence table D1, the node/element name converting means 4 replaces the name of the component to be converted with the name of an element and a node specified by the second circuit connection information on the basis of the corresponding relation. When the corresponding relation of the component to be converted is not indicated in the node/element name correspondence table D1, the node/element name converting means 4 replaces the name of the component to be converted with a name sequentially given from the unused name list NL. Then the node/element name converting means 4 outputs third circuit connection information D13.

Figure 2:
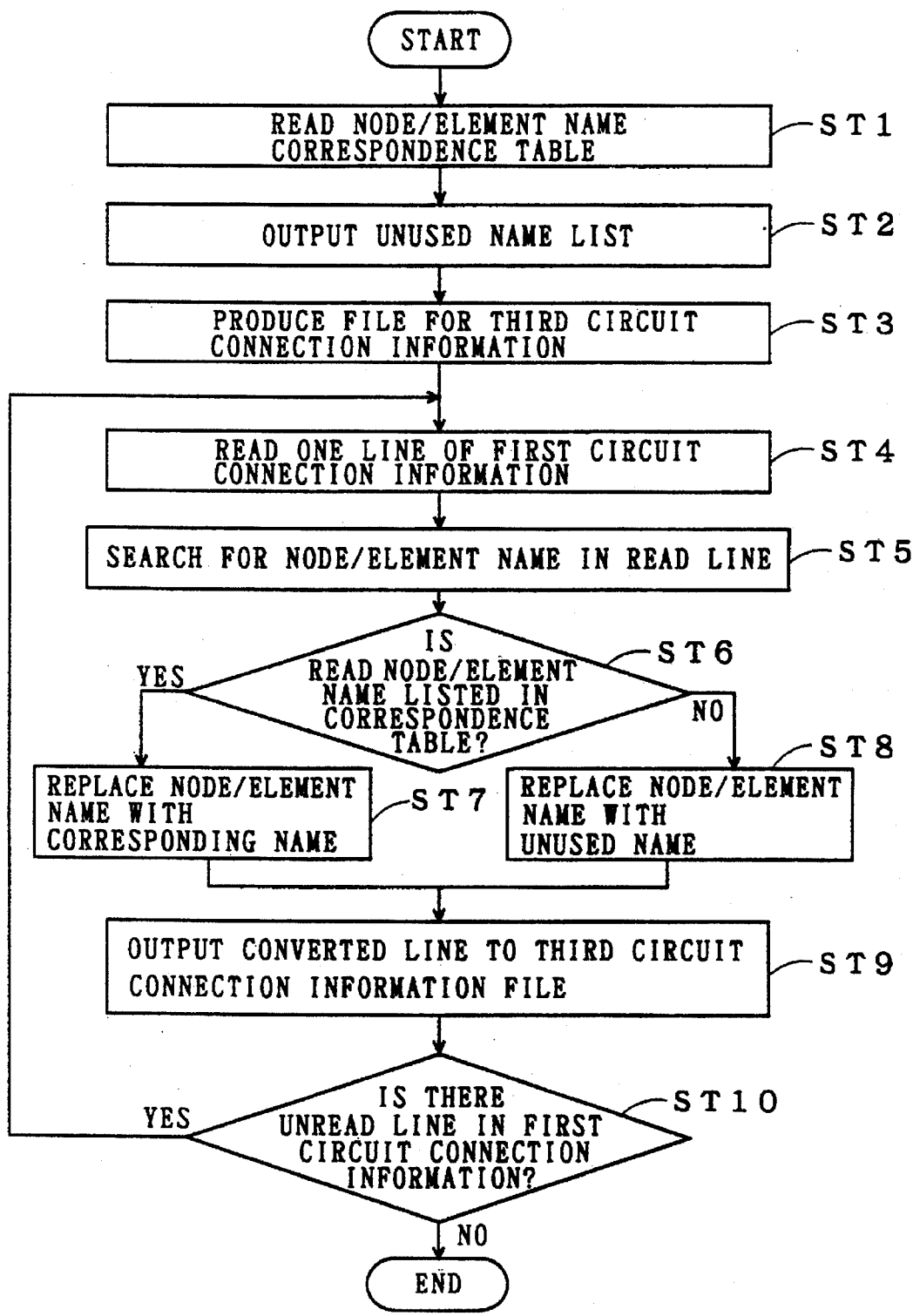
FIG. 2 is a flowchart illustrating the operation of the circuit connection information generating device of the first preferred embodiment.

FIG. 2 is a flowchart illustrating a generating method by the circuit connection information generating device of the first preferred embodiment. The generating method will be described below with reference to FIG. 2.

In the step ST1, the correspondence table read means I reads the node/element name correspondence table D1 to output the node/element name correspondence table D1 to the unused name generating means 3 and the node/element name converting means 4.

In the step ST2, the unused name generating means 3 outputs the unused name list NL containing the names unused in the second circuit connection information to the node/element name converting means 4 on the basis of the node/element name correspondence table D1.

In the step ST3, the node/element name converting means 4 previously produces an output file for the third circuit connection information D13.

Figure 13:
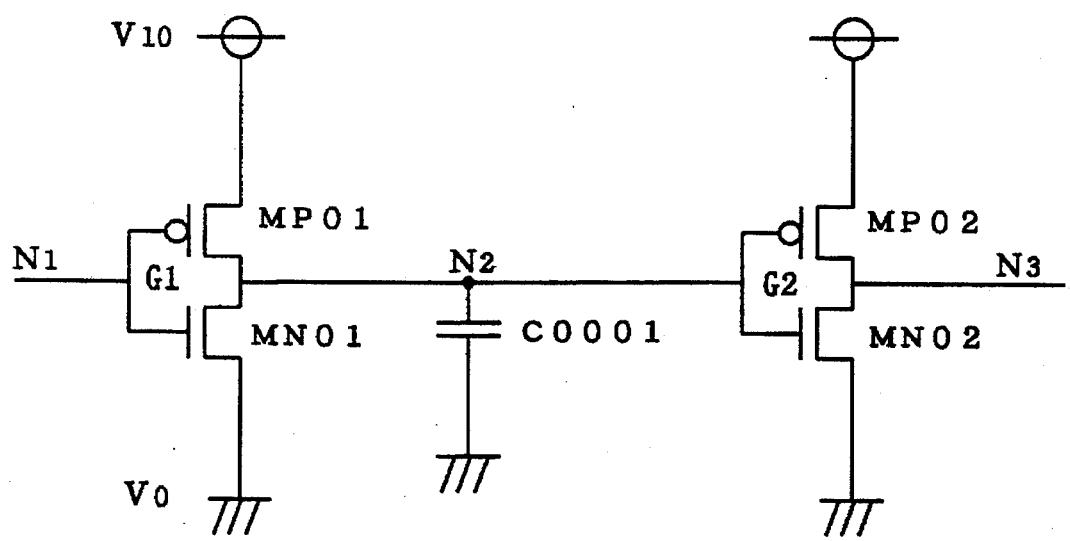
FIG. 13 is a circuit diagram of an exemplary circuit provided from a circuit drawing.

FIG. 13 is a circuit diagram of an example of the circuit drawing. FIG. 14 illustrates the second circuit connection information D12 associated with the circuit drawing of FIG. 13.

Referring to FIG. 13, a CMOS inverter G1 comprised of a PMOS transistor MP01 and an NMOS transistor MN01 and a CMOS inverter G2 comprised of a PMOS transistor MP02 and an NMOS transistor MN02 are connected in series. An input of the inverter G1 is a node N1, an output of the inverter G1 and an input of the inverter G2 are a node N2, and an output of the inverter G2 is a node N3. A capacitor C0001 is connected between the node N2 and ground.

Referring to FIG. 14, the second circuit connection information D12 indicates connections of the respective transistors and the capacitor. For instance, the first line of FIG. 14 indicates that an element having the name MP01 includes a drain connected to the node N2, a gate connected to the node N1, a source connected to a power supply node V10, and a node at a back gate potential connected to the power supply node V10, that the type of the element is a PMOS, and that the element has a gate length of 1 μm and a gate width of 10 μm. The fifth line of FIG. 14 indicates that an element having the name C0001 is a 1 pF capacitor connected between the node N2 and a power supply V0.

Figure 15:
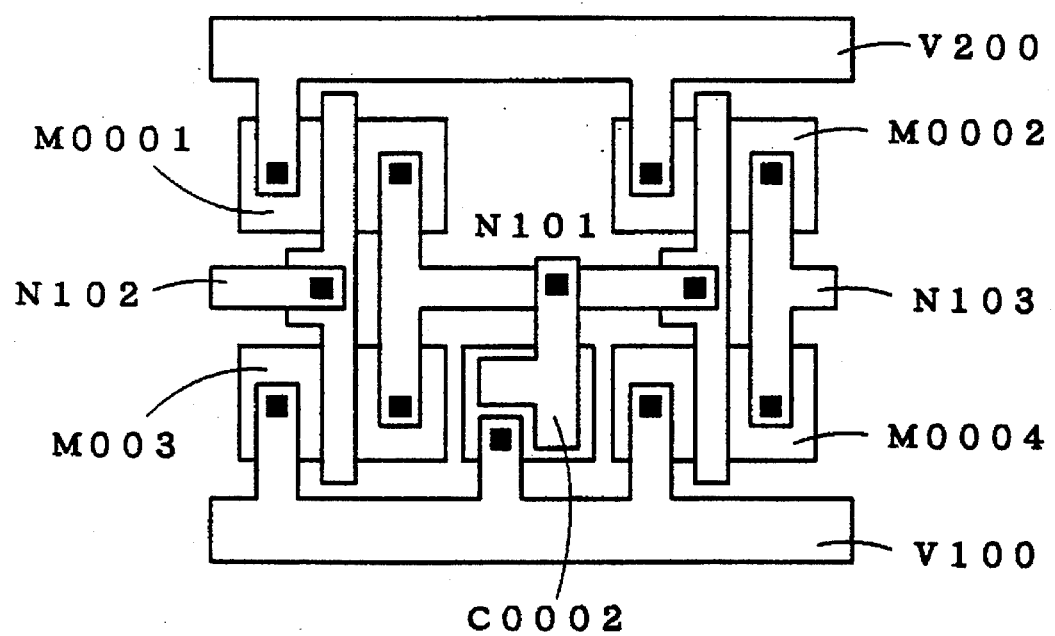
FIG. 15 is a plan view of an exemplary layout pattern.
Figure 16:
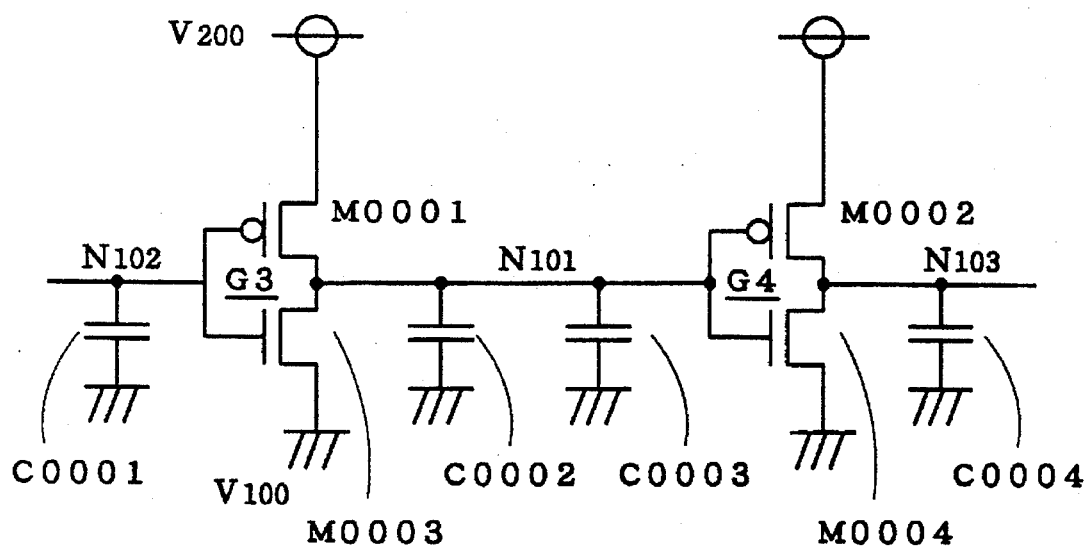
FIG. 16 is a circuit diagram of an exemplary circuit provided from the layout pattern.

FIG. 15 is a plan view of an exemplary layout pattern. FIG. 16 is an equivalent circuit thereof. Referring to FIGS. 15 and 16, M0001 and M0002 represent PMOS transistors (regions); M0003 and M0004 represent NMOS transistors (regions); V200 represents a power supply node (line); V100 represents a ground node (line); C0001 to C0004 represent capacitors (regions); and N101 to N103 represent nodes (regions).

FIG. 16 is an equivalent circuit diagram of the layout pattern of FIG. 15. A CMOS inverter G3 comprised of the PMOS transistor M0001 and the NMOS transistor M0003 and a CMOS inverter G4 comprised of the PMOS transistor M0002 and the NMOS transistor M0004 are connected in series. An input of the inverter G3 is the node N102, an output of the inverter G3 and an input of the inverter G4 are the node N101, and an output of the inverter G4 is the node N103. The capacitor C0001 is connected between the node N102 and ground. The capacitors C0002 and C0003 are connected between the node N101 and ground. The capacitor C0004 is connected between the node N103 and ground.

It should be noted that the capacitors C0001, C0003, C0004 are inevitably accompanying parasitic capacitances adjacent the regions of the nodes N101 and N103.

FIG. 17 illustrates the first circuit connection information D11 provided from the layout pattern shown in FIGS. 15 and 16. As shown in FIG. 17, for instance, the first line indicates that the transistor M0001 has a drain connected to the node N101, a gate connected to the node N102, a source connected to the power supply node V200, and a back gate potential connected to the power supply node V200, that the type of the transistor M0001 is a PMOS, and that the transistor M0001 has a gate length of 1 μm, a gate width of 10 μm, a source diffusion area of 50 pm$^2$, a drain diffusion area of 50 pm$^2$, a source perimeter length of 20 μm, a drain perimeter length of 20 μm, a channel to source contact distance ratio of 0.2, and a channel to drain contact distance ratio of 0.2.

FIG. 18 illustrates the node/element name correspondence table D1 for the second circuit connection information provided from the circuit drawing of FIG. 14 and the first circuit connection information provided from the layout pattern of FIG. 17. Referring to FIG. 18, for instance, the items in the first line indicate that the power supply node V0 in the second circuit connection information corresponds to the power supply node V100 in the first circuit connection information. The items in the sixth line indicate that the transistor MP01 in the second circuit connection information corresponds to the transistor M0001 in the first circuit connection information. The items in the tenth line indicate that the capacitor C0001 in the second circuit connection information corresponds to the capacitor C0002 in the first circuit connection information.

Referring again to FIG. 2, the first circuit connection information read means 2 reads one line of the first circuit connection information D11 having the contents as shown in FIG. 17 to output the one line to the node/element name converting means 4 in the step ST4.

The node/element name converting means 4 searches the node/element name correspondence table D1 for the node/element name in the read line in the step ST5, and then makes a YES/NO judgement as to whether or not the read node/element name is listed in the node/element name correspondence table D1 in the step ST6.

If the judgement is YES in the step ST6, the node/element name converting means 4 replaces the node/element name in the first circuit connection information D11 with the node/element name in the second circuit connection information on the basis of the node/element name correspondence table D1 in the step ST7, and then proceeds to the process of the step ST9.

If the judgement is NO in the step ST6, the node/element name converting means 4 replaces the node/element name in the first circuit connection information D11 with a new name given from the unused name list NL generated by the unused name generating means 3 in the step ST8, and then proceeds to the process of the step ST9.

In the step ST9, the node/element name converting means 4 outputs the converted line to the third circuit connection information file produced in the step ST3.

Then, in the step ST10, the node/element name converting means 4 judges the presence of a line of the first circuit connection information D11 which has not been read in the step ST4. If there is an unread line, the method returns to the step ST4, and the first circuit connection information read means 2 reads one unread line in the first circuit connection information D11.

The steps ST4 to ST10 are repeated until it is judged in the step ST10 that there is no unread line in the first circuit connection information D11.

Finally, the third circuit connection information D13 containing the parasitic elements added to the circuit connection information associated with the circuit drawing is provided. FIG. 19 illustrates the third circuit connection information D13 produced on the basis of the first circuit connection information D11 shown in FIG. 17 and the node/element name correspondence table D1 shown in FIG. 18.

Referring to FIG. 19, the transistors M0001 to M0004 in the correspondence table are replaced with the transistors MP01, MP02, MN01, MN02, respectively, and the capacitor C0002 is replaced with C0001. The capacitors C0001, C0003, C0004 which are not listed in the correspondence table are replaced with new names CC001, CC002, CC003 given from the unused name list NL, respectively.

In this manner, the circuit connection information generating device of the first preferred embodiment outputs the third circuit connection information D13 provided by automatically adding the parasitic elements specified by the first circuit connection information D11 and the connection information thereof, while replacing the contents of the first circuit connection information D11 with the contents of the second circuit connection information, on the basis of the node/element name correspondence table D1 and the first circuit connection information D11. Therefore, the circuit connection information generating device can generate the circuit connection information which correctly reflects the circuit connection information given from the circuit drawing and which contains the parasitic elements.

In addition, the circuit connection information generating device of the first preferred embodiment provides the first circuit connection information D11 and the node/element name correspondence table D1 indicative of the corresponding relation between the first circuit connection information D11 and the second circuit connection information, thereby producing the third circuit connection information D13. This eliminates the need for the circuit connection information generating device to read the circuit connection information given from the circuit drawing.

Further, the circuit connection information generating device of the first preferred embodiment can correctly apply the parasitic elements extracted from the layout pattern data to the circuit drawing, in circuit portions including logically identical but physically different transistor connections between the circuit drawing and the layout pattern data.

Figure 24:
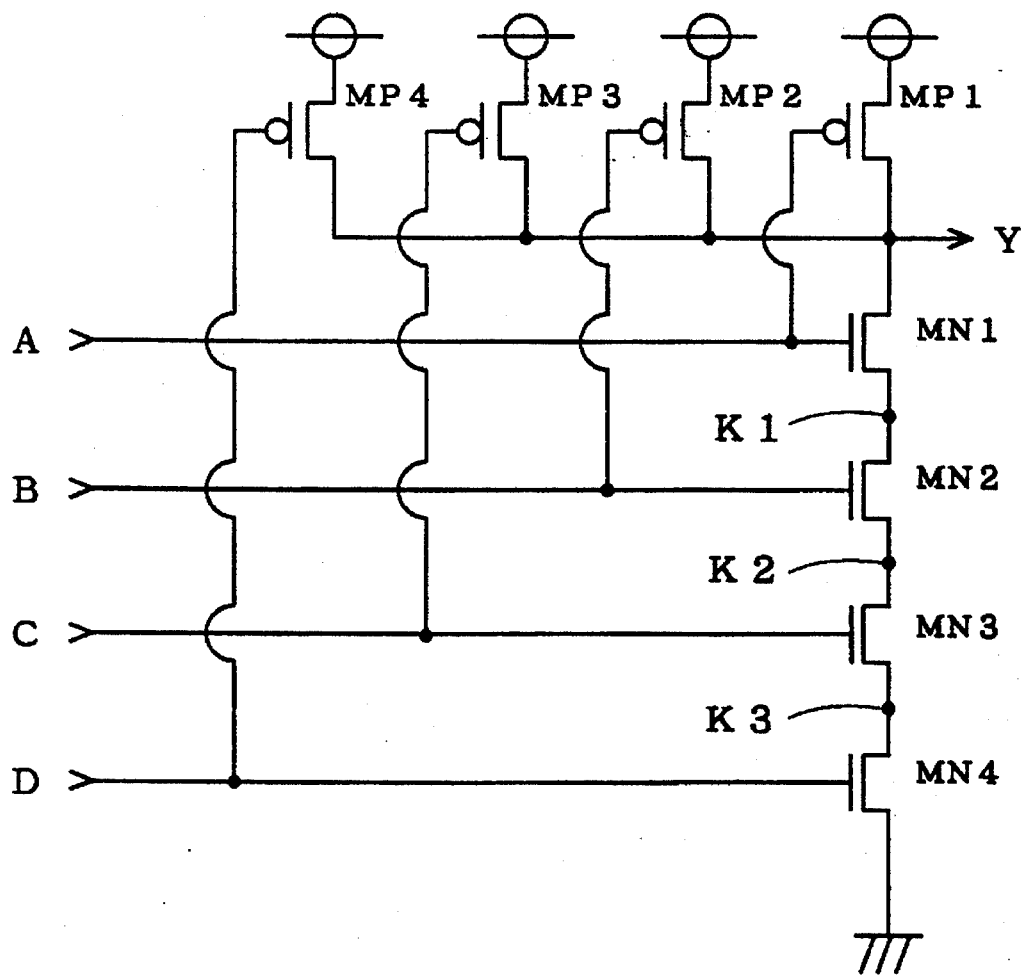
FIG. 24 is a circuit diagram of an exemplary circuit provided from the circuit drawing.
Figure 25:
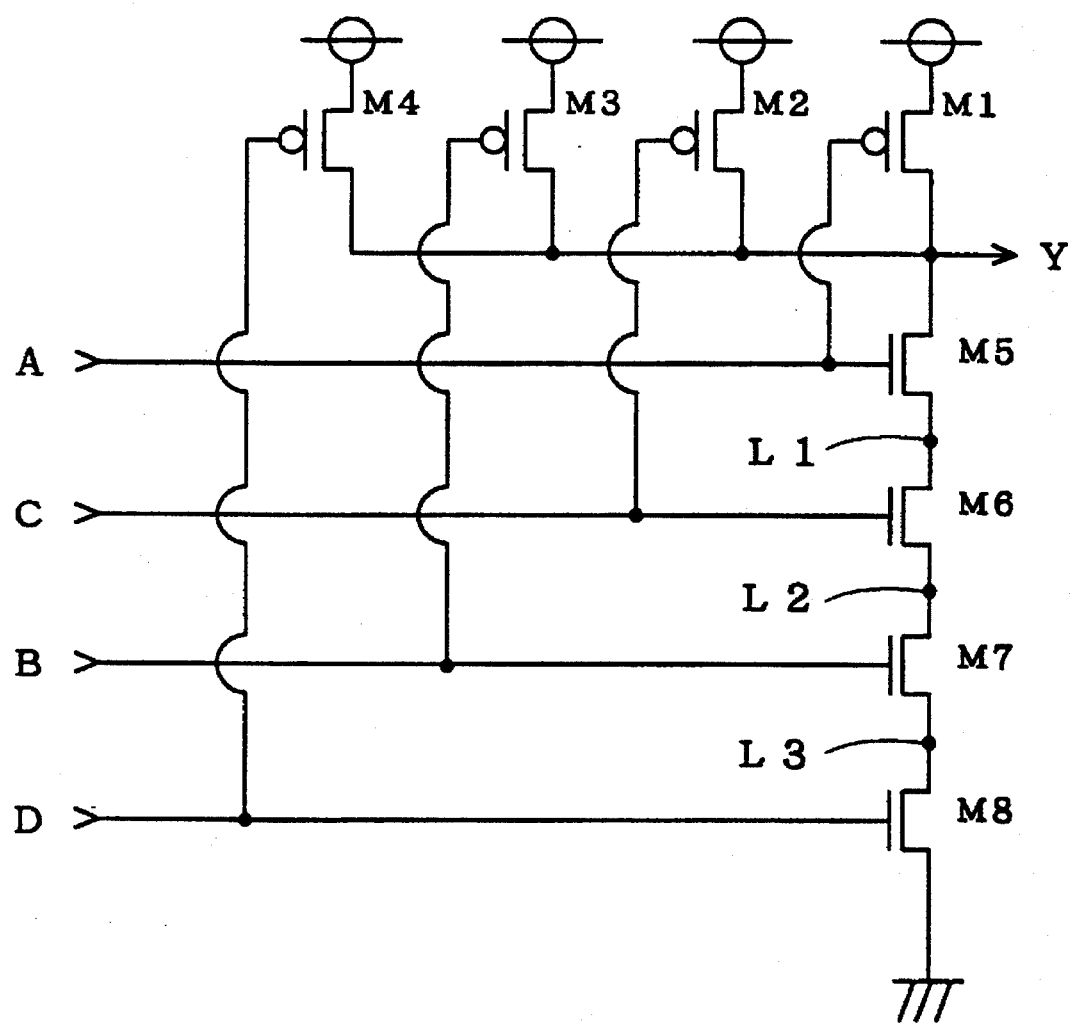
FIG. 25 is a circuit diagram of an exemplary circuit provided from the layout pattern.

The above described characteristics are discussed below with reference to FIGS. 24 to 26. FIG. 24 is an equivalent circuit diagram of a four-input NAND gate G11 provided from the circuit drawing. FIG. 25 is an equivalent circuit diagram of a four-input NAND gate G12 provided from the layout pattern.

Referring to FIGS. 24 and 25, the NAND gate G11 and the NAND gate G12 receive interchanged input signals B and C and, accordingly, are logically identical but physically different.

Figure 26:
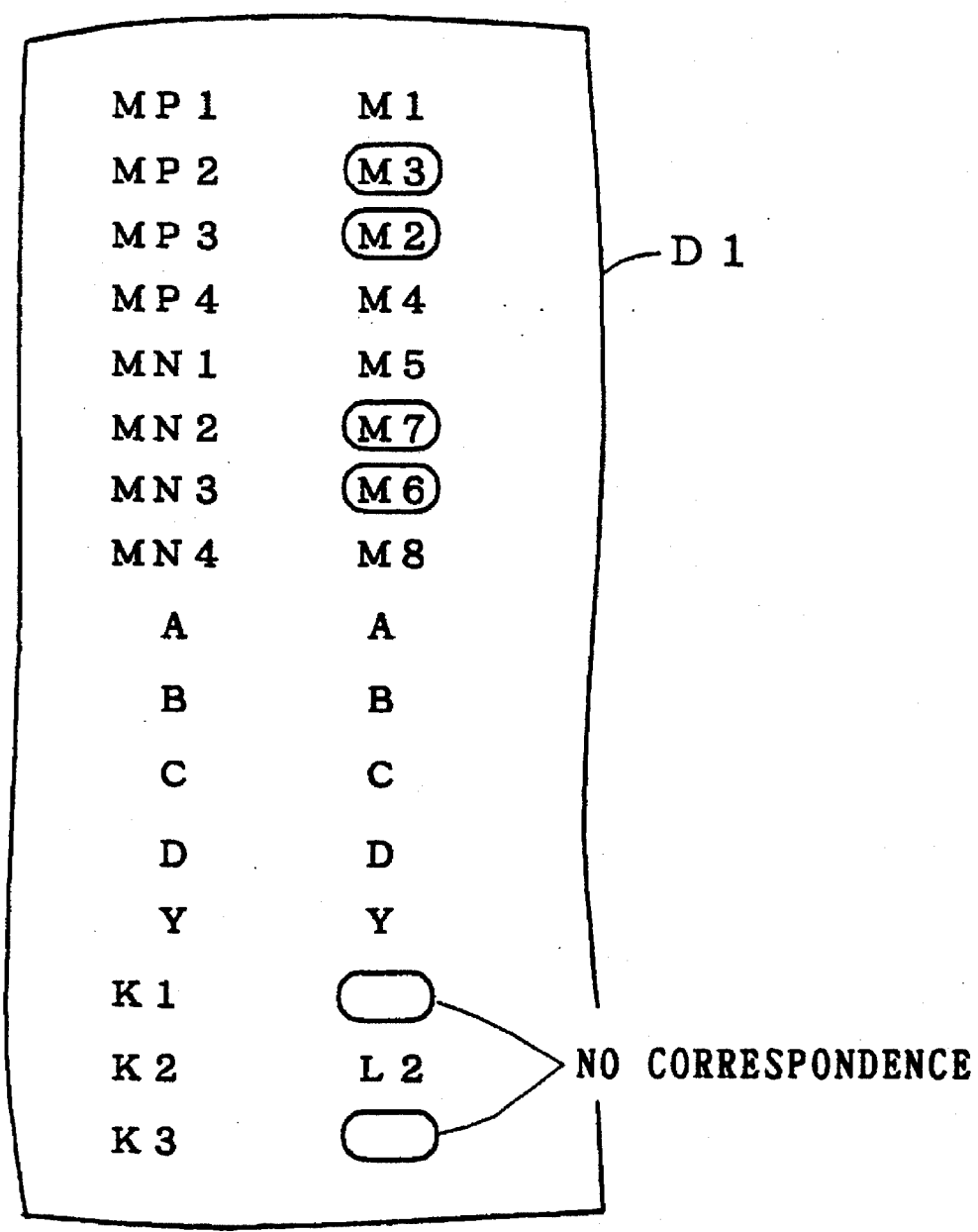
FIG. 26 illustrates an example of the node/element name correspondence table.
Figure 27:
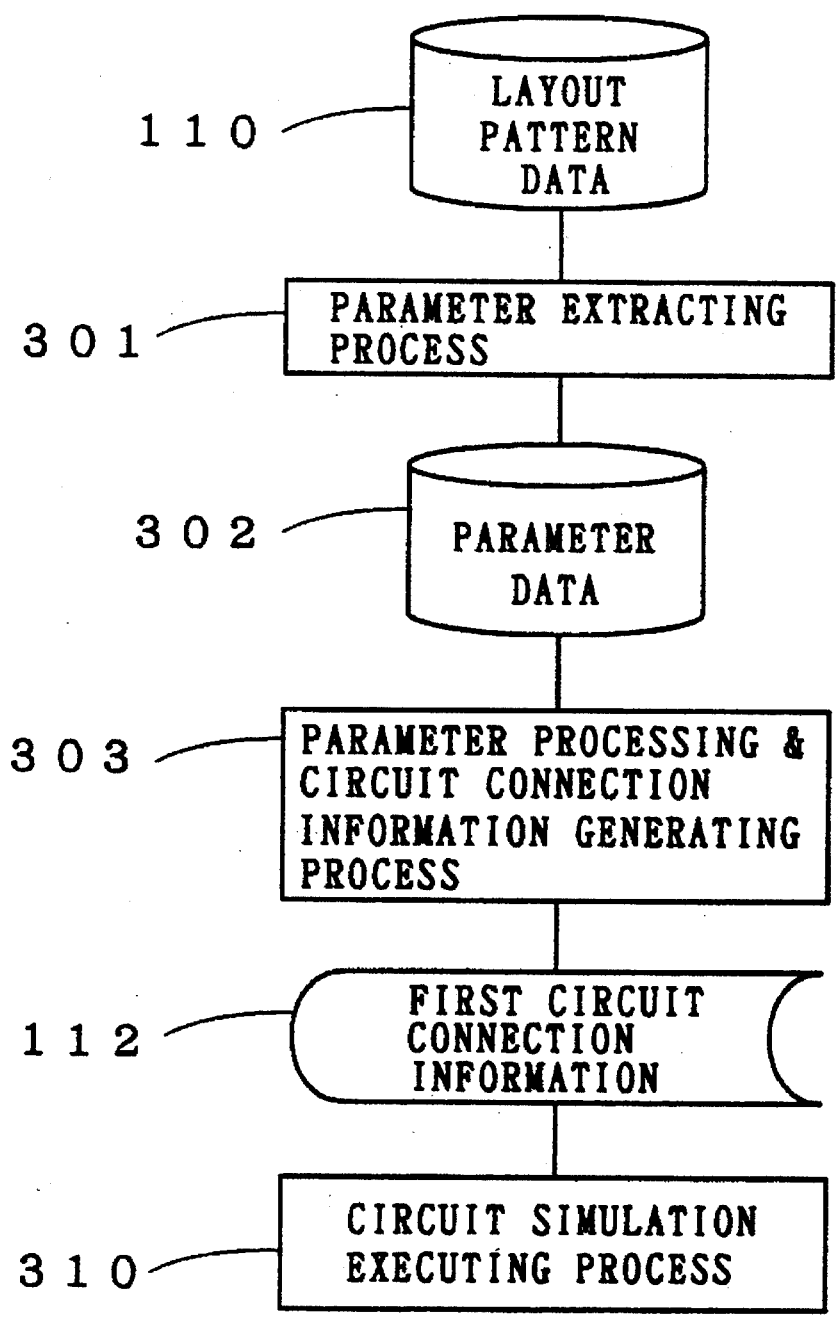
FIG. 27 illustrates a first example of the conventional circuit connection information generating process.
Figure 28:
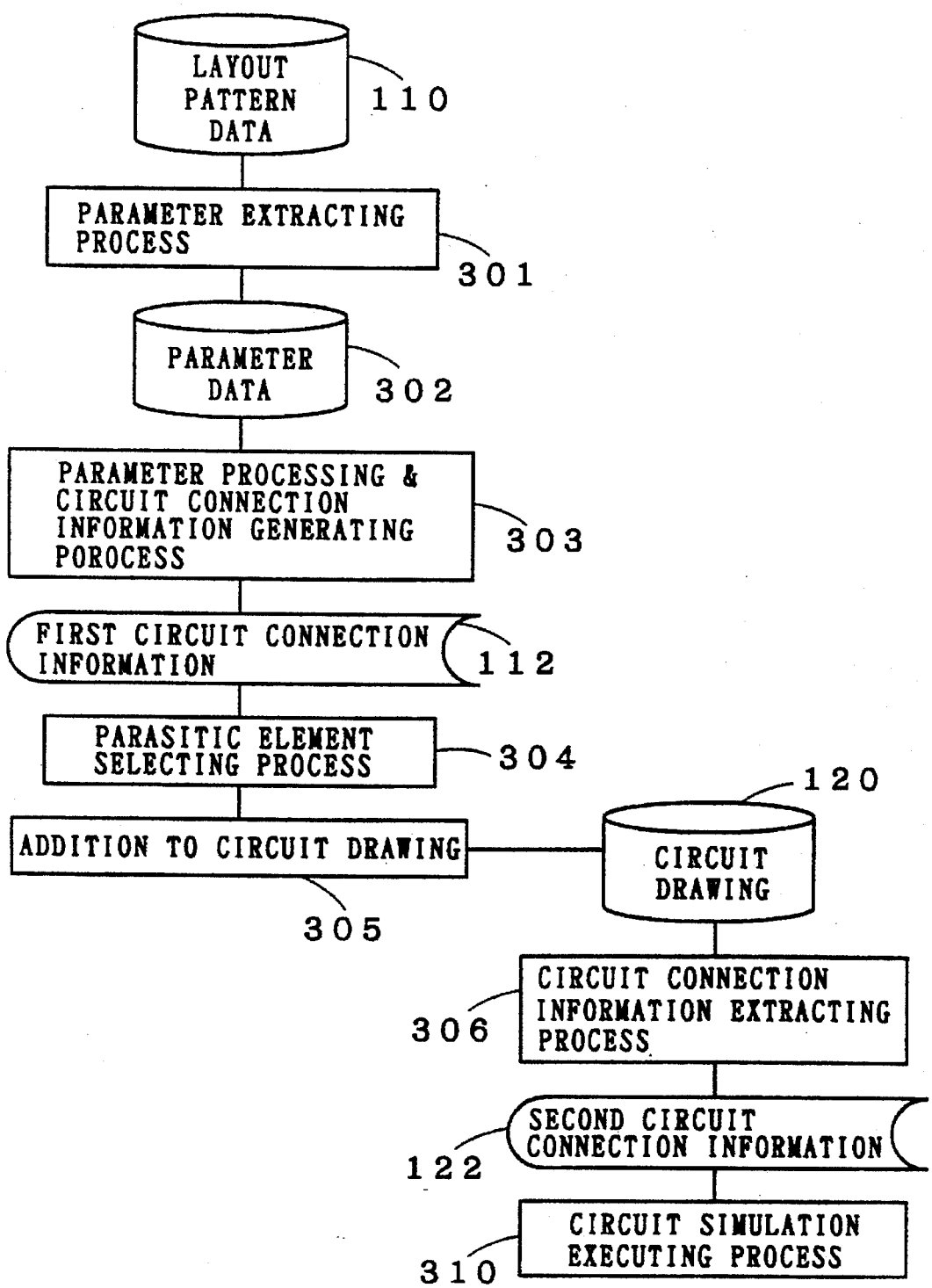
FIG. 28 illustrates a second example of the conventional circuit connection information generating process.

In this case, as shown in FIG. 26, the provision of the node/element name correspondence table D1 indicating that the transistors M3, M2, M7, M6 correspond respectively to the transistors MP2, MP3, MN2, MN3 and no nodes correspond to the nodes K1 and K3 permits the node/element name converting means 4 to perform conversion in consideration for the difference in physical construction.

In this fashion, the circuit connection information generating device of the first preferred embodiment reads the node/element name correspondence table D1 in consideration for the difference in physical construction to correctly add the parasitic elements extracted from the layout pattern data to the circuit drawing in the logically identical but physically different circuit portion.

Second Preferred Embodiment

Figure 3:
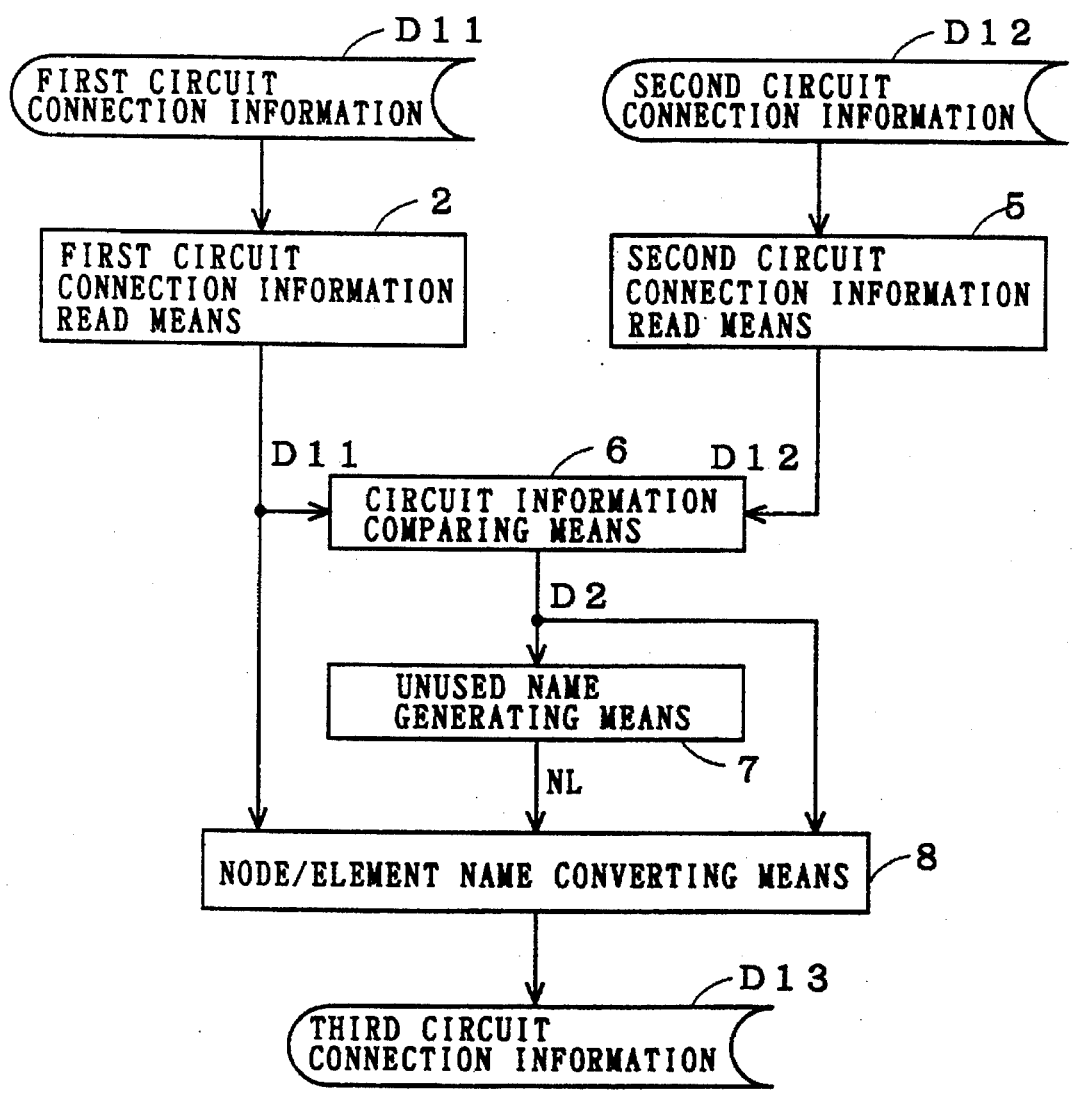
FIG. 3 is a block diagram of the circuit connection information generating device according to a second preferred embodiment of the present invention.

FIG. 3 is a block diagram of the circuit connection information generating device according to a second preferred embodiment of the present invention. Referring to FIG. 3, the first circuit connection information read means 2 reads the first circuit connection information D11, and a second circuit connection information read means 5 reads second circuit connection information D12.

The first circuit connection information D11 specifies elements extracted from the layout pattern data and element connections, and contains unique names given to respective elements and respective nodes which are connecting points between the elements. It should be noted that the elements specified by the first circuit connection information D11 include parasitic elements such as parasitic capacitances. The first circuit connection information D11 is provided by a first circuit connection information providing means (not shown) on the basis of the layout pattern data of a predetermined semiconductor integrated circuit.

The second circuit connection information D12 specifies elements extracted from a circuit drawing and element connections, and contains unique names given to respective elements and respective nodes which are connecting points between the elements. The second circuit connection information D12 is provided by a second circuit connection information providing means not shown on the basis of the circuit drawing of the above described predetermined semiconductor integrated circuit.

The first circuit connection information D11 read by the first circuit connection information read means 2 is received by a circuit information comparing means 6 and a node/element name converting means 8. The second circuit connection information D12 read by the second circuit connection information read means 5 is received by the circuit information comparing means 6.

The circuit information comparing means 6 produces node/element name correspondence information D2 including corresponding relation information, in a table form, wherein the names of the elements and nodes specified by the second circuit connection information D12 are listed in corresponding relation to the elements and nodes specified by the first circuit connection information D11 on the basis of the first circuit connection information D11 and second circuit connection information D12. The circuit information comparing means 6 then outputs the node/element name correspondence information D2 to an unused name generating means 7 and the node/element name converting means 8.

The unused name generating means 7 outputs the unused name list NL containing names unused in the second circuit connection information D12 to the node/element name converting means 8 on the basis of the node/element name correspondence information D2.

The node/element name converting means 8 performs the processing to be described below on a component to be converted which is each element or node specified by the first circuit connection information D11 on the basis of the node/element name correspondence information D2, the first circuit connection information D11 and the unused name list NL. That is, when the corresponding relation of the component to be converted is indicated in the node/element name correspondence information D2, the node/element name converting means 8 replaces the name of the component to be converted with the name of an element and a node specified by the second circuit connection information D12 on the basis of the corresponding relation. When the corresponding relation of the component to be converted is not indicated in the node/element name correspondence information D2, the node/element name converting means 8 replaces the name of the component to be converted with a name sequentially given from the unused name list NL. Then the node/element name converting means 8 outputs the third circuit connection information D13.

Figure 4:
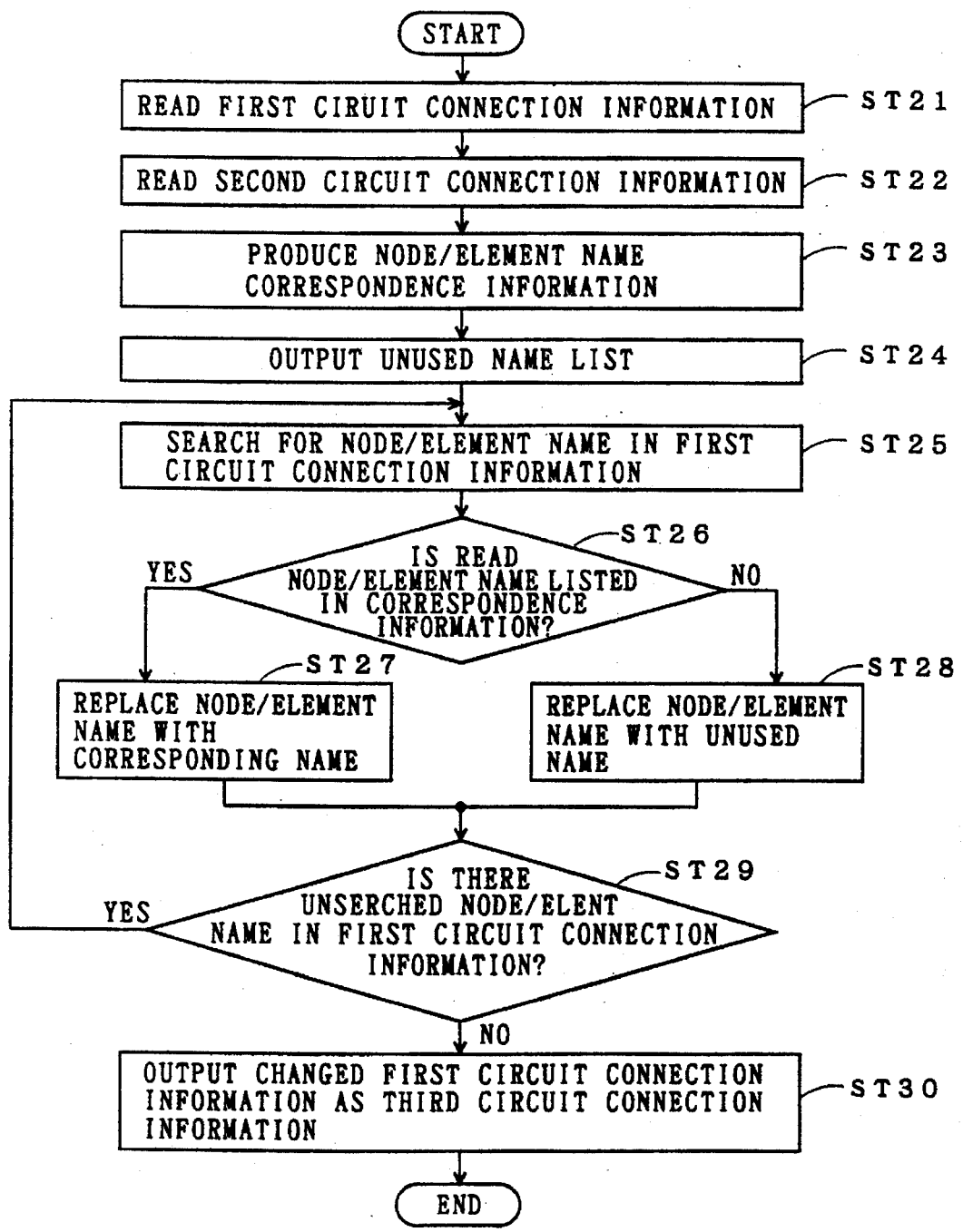
FIG. 4 is a flowchart illustrating the operation of the circuit connection information generating device of the second preferred embodiment.

FIG. 4 is a flow chart illustrating a generating method by the circuit connection information generating device of the second preferred embodiment. The generating method will be described below with reference to FIG. 4.

In the step ST21, the first circuit connection information read means 2 reads the first circuit connection information D11. In the step ST22, the second circuit connection information read means 5 reads the second circuit connection information D12.

In the step ST23, the circuit information comparing means 6 produces the node/element name correspondence information D2 on the basis of the first circuit connection information D11 and the second circuit connection information D12 to output the node/element name correspondence information D2 to the unused name generating means 7 and the node/element name converting means 8.

In the step ST24, the unused name generating means 7 outputs the unused name list NL containing the names unused in the second circuit connection information D12 to the node/element name converting means 8 on the basis of the node/element name correspondence information D2.

The node/element name converting means 8 searches the node/element name correspondence information D2 for the node/element name in the read line in the first circuit connection information D11 in the step ST25, and makes a YES/NO judgement as to whether or not the read node/element name is listed in the node/element name correspondence information D2 in the step ST26.

If the judgement is YES in the step ST26, the node/element name converting means 8 replaces the node/element name in the first circuit connection information D11 with the node/element name in the second circuit connection information D12 on the basis of the node/element name correspondence information D2 in the step ST27, and then proceeds to the step ST29.

If the judgement is NO in the step ST26, the node/element name converting means 8 replaces the node/element name in the first circuit connection information D11 with a new name given from the unused name list NL produced by the unused name generating means 3 in the step ST28, and then proceeds to the step ST29.

Then, in the step ST29, the node/element name converting means 8 judges the presence of a node/element name in the first circuit connection information D11 which has not been searched for in the step ST29. If there is an unsearched node/element name, the method returns to the step ST25. If there is no unsearched node/element name, the method proceeds to the step ST30.

The steps ST25 to ST29 are repeated until it is judged in the step ST29 that there is no unsearched node/element name.

Finally, in the step ST30, the node/element name converting means 8 outputs the first circuit connection information D11 which is subjected to the node/element name changes in the steps ST25 to ST29 as the third circuit connection information D13.

In this manner, the circuit connection information generating device of the second preferred embodiment outputs the third circuit connection information D13 provided by automatically adding the parasitic elements specified by the first circuit connection information D11 and the connection information thereof, while replacing the contents of the first circuit connection information D11 with the contents of the second circuit connection information D12, on the basis of the first circuit connection information D11 and second circuit connection information D12. Therefore, the circuit connection information generating device can generate the circuit connection information which correctly reflects the circuit connection information given from the circuit drawing and which contains the parasitic elements.

In addition, the circuit connection information generating device of the second preferred embodiment provides the node/element name correspondence information D2 (corresponding to the node/element name correspondence table D1 of the first preferred embodiment) indicative of the corresponding relation between the first circuit connection information D11 and the second circuit connection information D12 only by reading the first circuit connection information D11 and the second circuit connection information D12, thereby producing the third circuit connection information D13. Required information is only the first circuit connection information D11 and the second circuit connection information D12, and there is no need to previously provide the node/element name correspondence table D1 of the first preferred embodiment.

Further, the circuit connection information generating device of the second preferred embodiment produces therein the node/element name correspondence information D2 in consideration for the circuit portion including logically identical but physically different transistor connections, like the first preferred embodiment, to correctly apply the parasitic elements extracted from the layout pattern data to the circuit drawing in the logically identical but physically different circuit portion.

Third Preferred Embodiment

Figure 5:
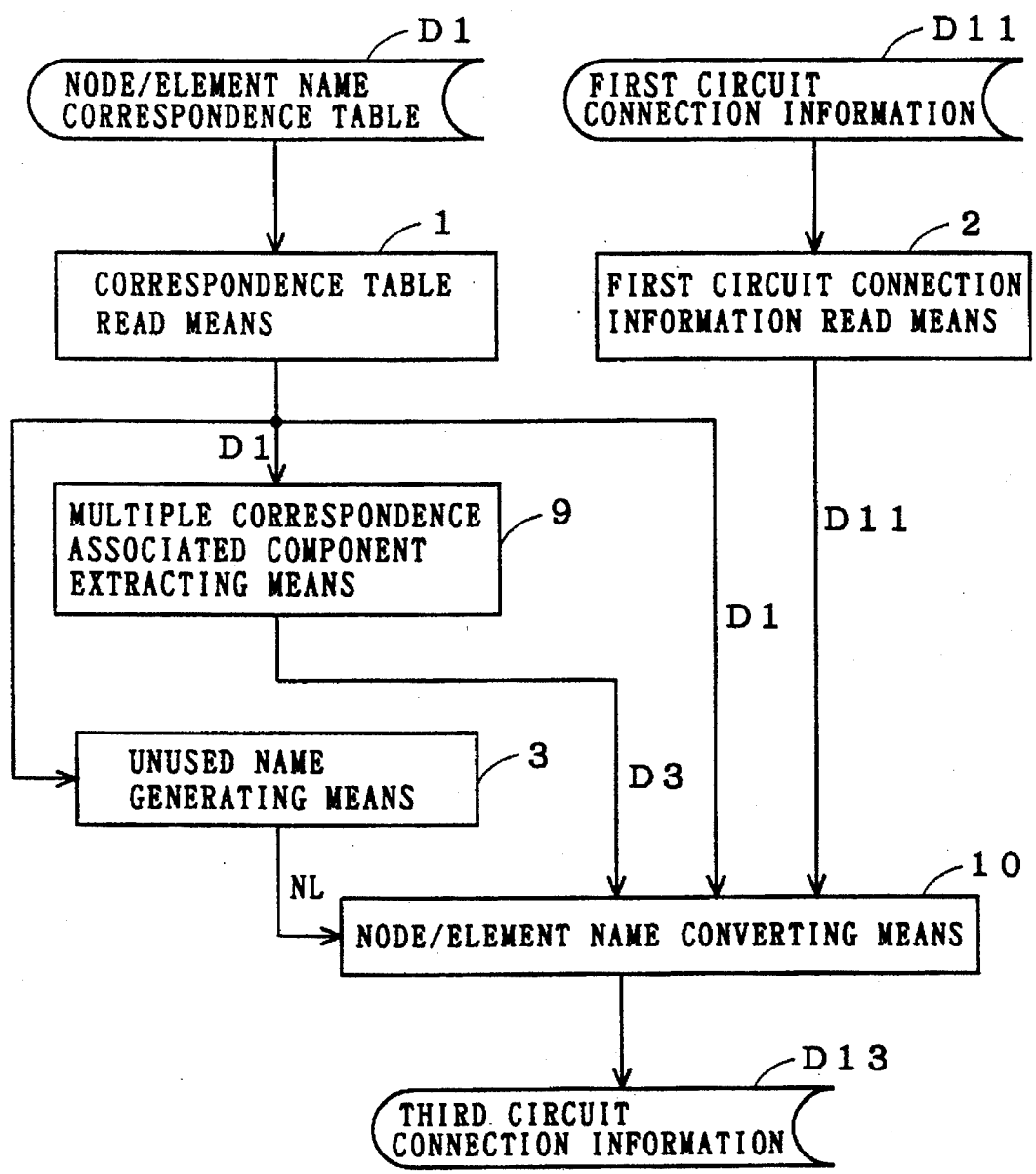
FIG. 5 is a block diagram of the circuit connection information generating device according to a third preferred embodiment of the present invention.

FIG. 5 is a block diagram of the circuit connection information generating device according to a third preferred embodiment of the present invention. In the same manner as in the first preferred embodiment, the correspondence table read means 1 reads the node/element name correspondence table D1, and the first circuit connection information read means 2 reads the first circuit connection information D11. The first circuit connection information D11 is provided by a first circuit connection information providing means (not shown) on the basis of the layout pattern data of a predetermined semiconductor integrated circuit.

The node/element name correspondence table D1 read by the correspondence table read means 1 is received by the unused name generating means 3, a multiple correspondence associated component extracting means 9 and a node/element name converting means 10. The first circuit connection information D11 read by the first circuit connection information read means 2 is received by the node/element name converting means 10.

The unused name generating means 3 outputs the unused name list NL containing names unused in the second circuit connection information to the node/element name converting means 10 on the basis of the node/element name correspondence table D1.

The multiple correspondence associated component extracting means 9 extracts a multiple correspondence component which is a node specified by the second circuit connection information and having a corresponding relation with a plurality of nodes and also extracts a selected component which is one of a plurality of nodes specified by the first circuit connection information D11 and corresponding to the multiple correspondence component, on the basis of the node/element name correspondence table D1, to output multiple correspondence associated component information D3 to the node/element name converting means 10.

The node/element name converting means 10 performs the processing to be described below on a component to be converted which is each element or node specified by the first circuit connection information D11 on the basis of the node/element name correspondence table D1, the first circuit connection information D11, the unused name list NL, and the multiple correspondence associated component information D3. That is, when the condition 1 described below is satisfied, the node/element name converting means 10 replaces the name of the component to be converted with the name of an element and a node specified by the second circuit connection information on the basis of the corresponding relation in the node/element name correspondence table D1. When the condition 1 is not satisfied, the node/element name converting means 10 replaces the name of the component to be converted with a name sequentially given from the unused name list NL. Then the node/element name converting means 10 outputs the third circuit connection information D13.

Condition 1: either the condition 1A or the condition 1B is satisfied.

Condition 1A: the corresponding relation of the component to be converted is indicated in the node/element name correspondence table D1 but does not contain the multiple correspondence component.

Condition 1B: the corresponding relation of the component to be converted is indicated in the node/element name correspondence table D1 and both the multiple correspondence component and the selected component establish the corresponding relation.

Figure 6:
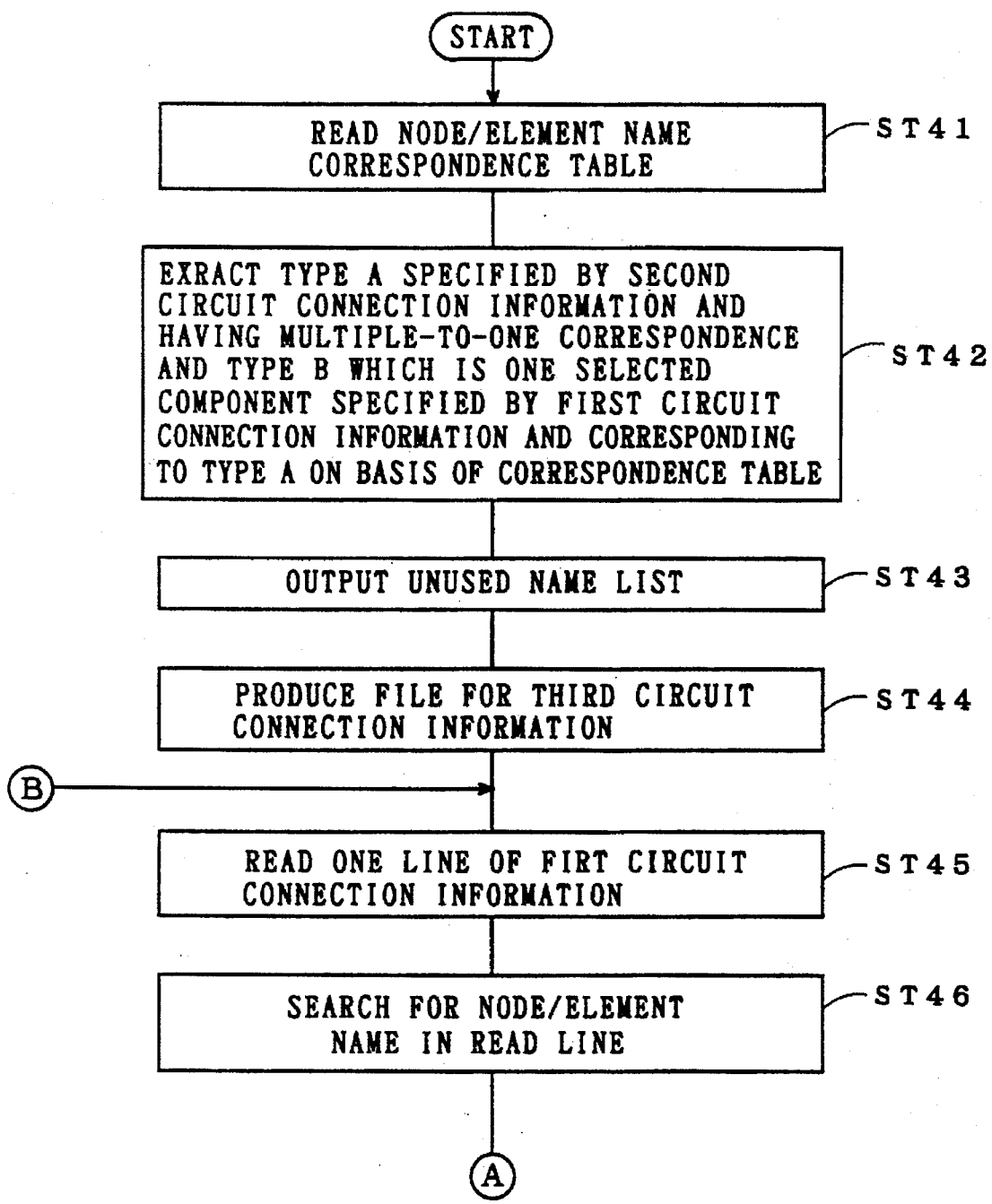
FIGS. 6 and 7 are flowcharts illustrating the operation of the circuit connection information generating device of the third preferred embodiment.
Figure 7:
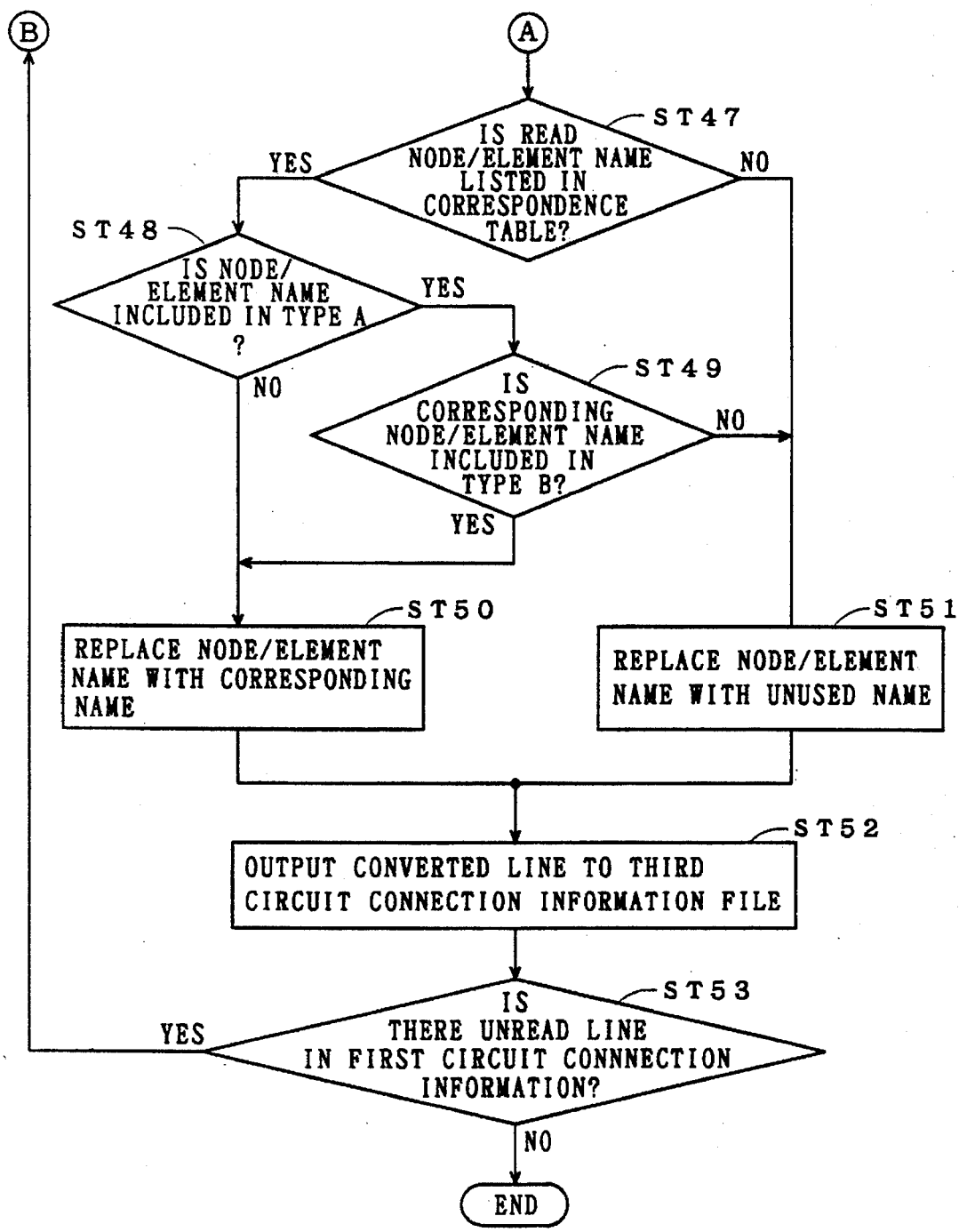

FIGS. 6 and 7 are flowcharts illustrating a generating method by the circuit connection information generating device of the third preferred embodiment. The generating method will be described below with reference to FIGS. 6 and 7.

In the step ST41, the correspondence table read means 1 reads the node/element name correspondence table D1 and then outputs the node/element name correspondence table D1 to the unused name generating means 3, the multiple correspondence associated component extracting means 9 and the node/dement name converting means 10.

In the step ST42, the multiple correspondence associated component extracting means 9 extracts, as the multiple correspondence component (type A), the node or element specified by the second circuit connection information and having the corresponding relation (multiple-to-one correspondence) with the plurality of nodes or elements and also extracts, as the selected component (type B), one of the plurality of components specified by the first circuit connection information D11 and corresponding to the component of the type A, on the basis of the node/element name correspondence table D1, to output the multiple correspondence associated component information D3 to the node/element name converting means 10.

Figure 20:
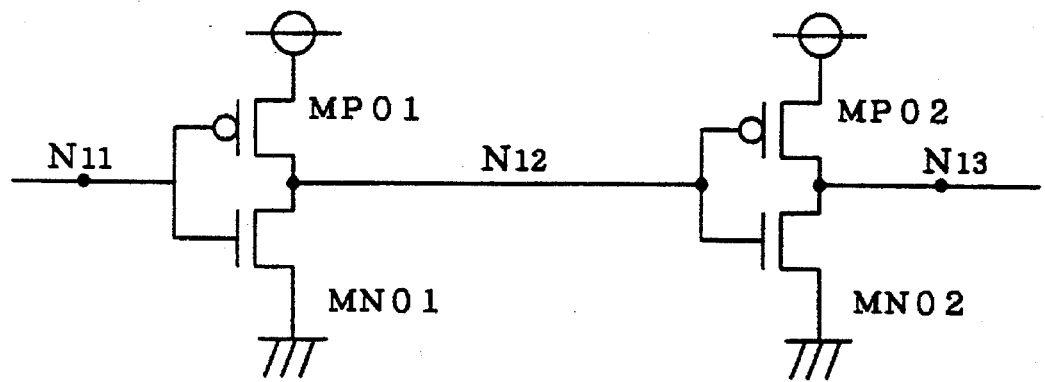
FIG. 20 is a circuit diagram of an exemplary circuit provided from the circuit drawing.
Figure 21:
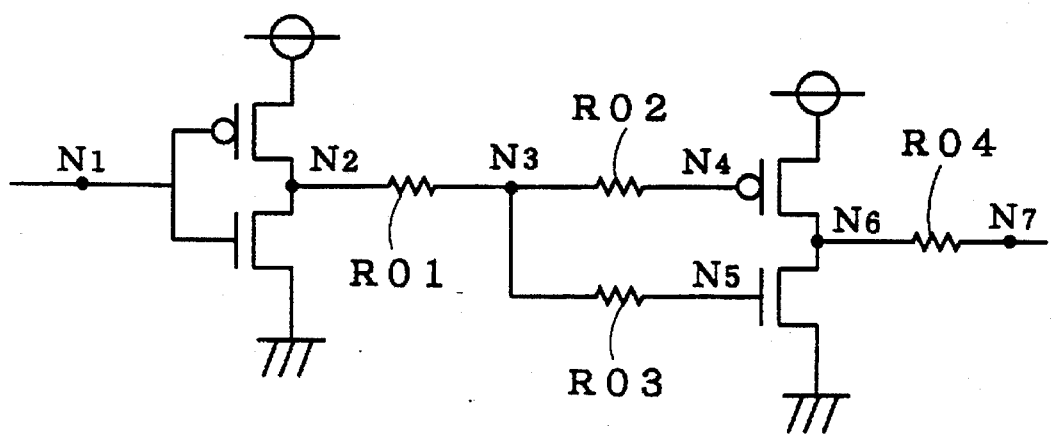
FIG. 21 is a circuit diagram of an exemplary circuit provided from the layout pattern.

The specific examples of the multiple correspondence component (type A) and the selected component (type B) will be discussed with reference to the drawings. FIG. 20 is a circuit diagram specified by the second circuit connection information. FIG. 21 is a circuit diagram specified by the first circuit connection information. In such a case, the node/element name correspondence table D1 is provided in which nodes N11 to N13 in the second circuit connection information and nodes N1 to N7 in the first circuit connection information are in the corresponding relation illustrated in FIG. 22.

Figures 22, 23:
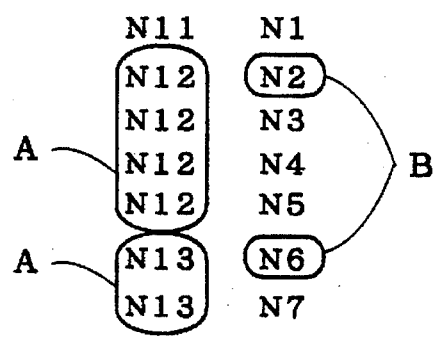
FIG. 22 illustrates an example of the node/element name correspondence table.
FIG. 23 illustrates an example of parasitic element insertion information.

On receipt of the node/element name correspondence table D1 illustrated in FIG. 22, the multiple correspondence associated component extracting means 9 extracts the nodes N12 and N13 as the multiple correspondence components (type A) and selects the node N2 and N6 as the selected components (type B) corresponding respectively to the multiple correspondence components N12 and N13.

The selected component corresponding to the node N12 may be one of the nodes N2 to N5. Likewise, the selected component corresponding to the node N13 may be one of the nodes N6 and N7.

Referring again to FIGS. 6 and 7, the unused name generating means 3 outputs the unused name list NL containing the names unused in the first circuit connection information D11 and the second circuit connection information to the node/element name convening means 10 on the basis of the node/element name correspondence table D1 in the step ST43.

In the step ST44, the node/element name convening means 10 previously produces an output file for the third circuit connection information D13.

In the step ST45, the first circuit connection information read means 2 reads one line of the first circuit connection information D11 having the contents shown in FIG. 17 to output the one line to the node/element name convening means 10.

The node/element name converting means 10 searches the node/element name correspondence table D1 for the node/element name in the read line in the step ST46, and then makes a YES/NO judgement as to whether or not the read node/element name is listed in the node/element name correspondence table D1 in the step ST47. If the judgement is YES in the step ST47, the method proceeds to the step ST48. If the judgement is NO in the step ST47, the method proceeds to the step ST51.

In the step ST48, the node/element name converting means 10 makes a YES/NO judgement as to whether or not the read node/element name fits the multiple correspondence component (type A). If the judgement is YES, the method proceeds to the step ST49. If the judgement is NO, the method proceeds to the step ST50.

In the step ST49, the node/element name converting means 10 makes a YES/NO judgement as to whether or not the node/element name specified by the first circuit connection information and corresponding to the multiple correspondence component fits the selected component (type B). If the judgement is YES, the method proceeds to the step ST50. If the judgment is NO, the method proceeds to the step ST51.

In the step ST50, the node/element name converting means 10 replaces the node/element name in the first circuit connection information D11 with the node/element name in the second circuit connection information on the basis of the node/element name correspondence table D1, and then proceeds to the step ST52.

On the other hand, in the step ST51, the node/element name converting means 10 replaces the node/element name in the first circuit connection information D11 with a new name given from the unused name list NL produced by the unused name generating means 3, and then proceeds to the step ST52.

In the step ST52, the node/element name converting means 10 outputs the converted line to the third circuit connection information file produced in the step ST43.

Then, in the step ST53, the node/element name converting means 10 judges the presence of a line of the first circuit connection information D11 which has not been read in the step ST45. If there is an unread line, the method returns to the step ST45 and the first circuit connection information read means 2 reads one unread line of the first circuit connection information D11.

The node/element name converting means 10 repeats the steps ST45 to ST52 until it is judged in the step ST53 that there is no unread line in the first circuit connection information D11.

Finally, like in the first and second preferred embodiments, the third circuit connection information D13 is provided which contains the parasitic elements added to the circuit connection information associated with the circuit drawing.

In this manner, the circuit connection information generating device of the third preferred embodiment outputs the third circuit connection information D13 containing the elements including parasitic elements and their connection information added to the circuit connection information based on the circuit drawing on the basis of the node/element name correspondence table D1 and the first circuit connection information D11. Therefore, the circuit connection information generating device produces the circuit connection information which correctly reflects the circuit connection information given from the circuit drawing and which contains the parasitic elements.

In addition, when the multiple correspondence component is listed in the node/element name correspondence table D1, the multiple correspondence associated component extracting means 9 takes one of the plurality of components corresponding to the multiple correspondence component as the selected component. Further, if the condition 1 is satisfied, the node/element name converting means 10 replaces the name of the component to be converted with the name of the element and node specified by the second circuit connection information on the basis of the corresponding relation in the node/element name correspondence table D1.

If the condition 1 is not satisfied, the node/element name converting means 10 replaces the name of the component to be converted with the name provided by sequentially adopting from the unused name list NL. Then the node/element name converting means 10 provides the third circuit connection information D13.

As a result, the node in the first circuit connection information D11 is correctly reflected on the circuit specified by the second circuit connection information in the absence of the node (element) in the circuit specified by the second circuit connection information corresponding to the node (element) in the circuit specified by the first circuit connection information D11. The third circuit connection information D13 becomes more correct.

Further, the circuit connection information generating device of the third preferred embodiment provides the first circuit connection information D11 and the node/element name correspondence table D1 indicative of the corresponding relation between the first circuit connection information D11 and the second circuit connection information, thereby producing the third circuit connection information D13. This eliminates the need for the circuit connection information generating device to directly read the circuit connection information given from the circuit drawing.

Further, the circuit connection information generating device of the third preferred embodiment can correctly apply the parasitic elements extracted from the layout pattern data to the circuit drawing, in the circuit portion including logically identical but physically different transistor connections between the circuit drawing and the layout pattern data, like the first and second preferred embodiments.

Fourth Preferred Embodiment

Figure 8:
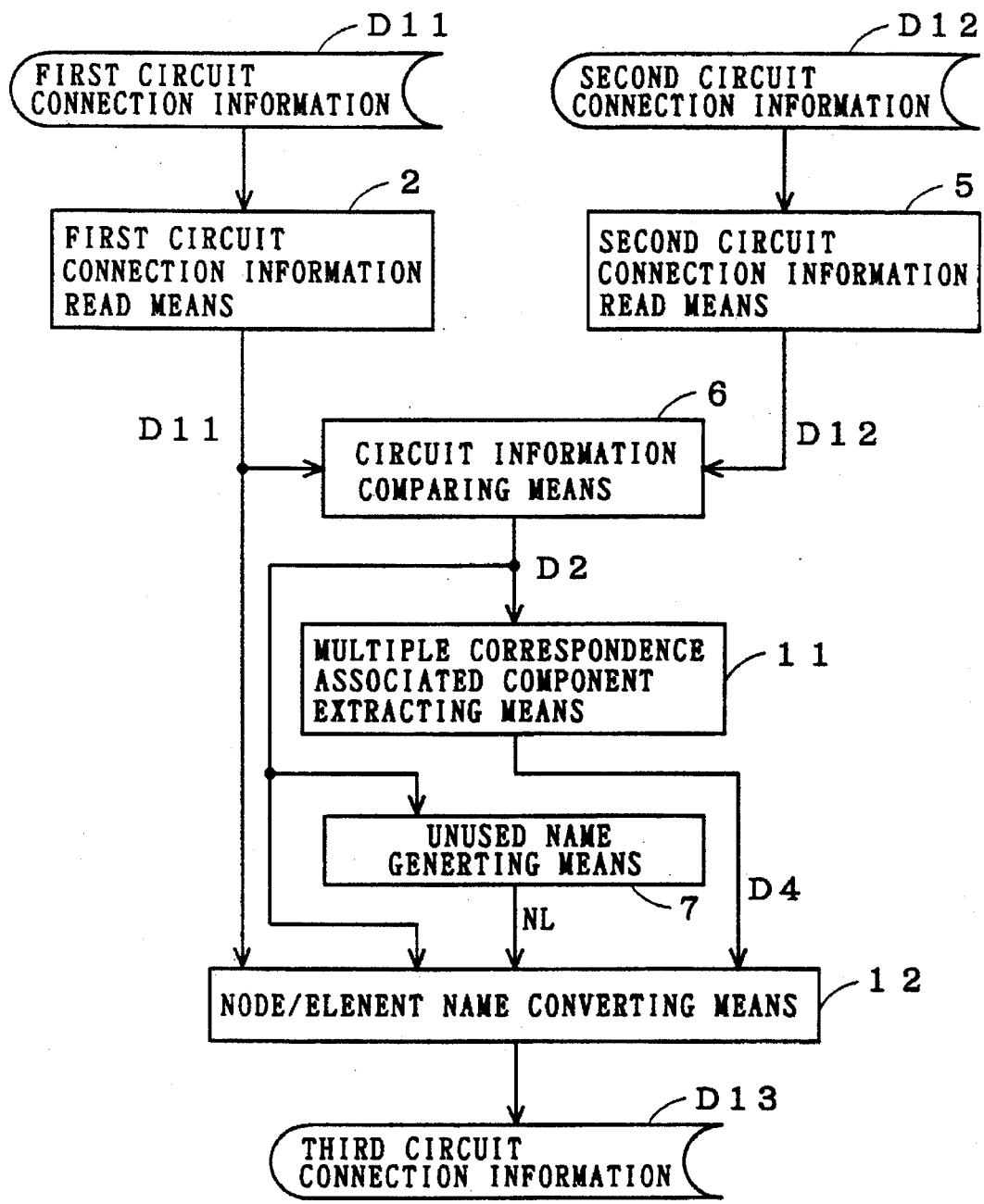
FIG. 8 is a block diagram of the circuit connection information generating device according to a fourth preferred embodiment of the present invention.

FIG. 8 is a block diagram of the circuit connection information generating device according to a fourth preferred embodiment of the present invention. As in the second preferred embodiment, the first circuit connection information read means 2 reads the first circuit connection information D11 and the second circuit connection information read means 5 reads the second circuit connection information D12 as illustrated in FIG. 8. The first circuit connection information D11 is provided by a first circuit connection information providing means (not shown) on the basis of the layout pattern data of a predetermined semiconductor integrated circuit. The second circuit connection information D12 is provided by a second circuit connection information providing means (not shown) on the basis of the circuit drawing of the above described predetermined semiconductor integrated circuit.

The circuit information comparing means 6 produces the node/element name correspondence information D2 including the corresponding relation information, in a table form, wherein the names of the elements and nodes specified by the second circuit connection information D12 are listed in corresponding relation to the elements and nodes specified by the first circuit connection information D11 on the basis of the first circuit connection information D11 and the second circuit connection information D12. The circuit information comparing means 6 then outputs the node/element name correspondence information D2 to the unused name generating means 7, a multiple correspondence associated component extracting means 11, and a node/element name converting means 12.

The unused name generating means 7 outputs the unused name list NL containing names unused in the second circuit connection information D12 to the node/element name converting means 12 on the basis of the node/element name correspondence information D2.

The multiple correspondence associated component extracting means 11 extracts the multiple correspondence component which is a node specified by the second circuit connection information D12 and having a corresponding relation with a plurality of nodes or elements and also extracts the selected component which is one of a plurality of components specified by the first circuit connection information D11 and corresponding to the multiple correspondence component, on the basis of the node/element name correspondence information D2, to output multiple correspondence associated component information D4 to the node/element name converting means 12.

The node/element name converting means 12 performs the processing to be described below on a component to be converted which is each element or node specified by the first circuit connection information D11 on the basis of the node/element name correspondence information D2, the first circuit connection information D11, the unused name list NL and the multiple correspondence associated component information D4. That is, when the condition 1 described below is satisfied, the node/element name converting means 12 replaces the name of the component to be converted with the name of an element and a node specified by the second circuit connection information D12 on the basis of the corresponding relation in the node/element name correspondence information D2. When the condition 1 is not satisfied, the node/element name converting means 12 replaces the name of the component to be converted with a name sequentially given from the unused name list NL. Then the node/element name converting means 12 outputs the third circuit connection information D13.

Condition 1: either the condition 1A or the condition 1B is satisfied.

Condition 1A: the corresponding relation of the component to be converted is indicated in the node/element name correspondence information D2 but does not contain the multiple correspondence component.

Condition 1B: the corresponding relation of the component to be converted is indicated in the node/element name correspondence information D2 and both the multiple correspondence component and the selected component establish the corresponding relation.

Figure 9:
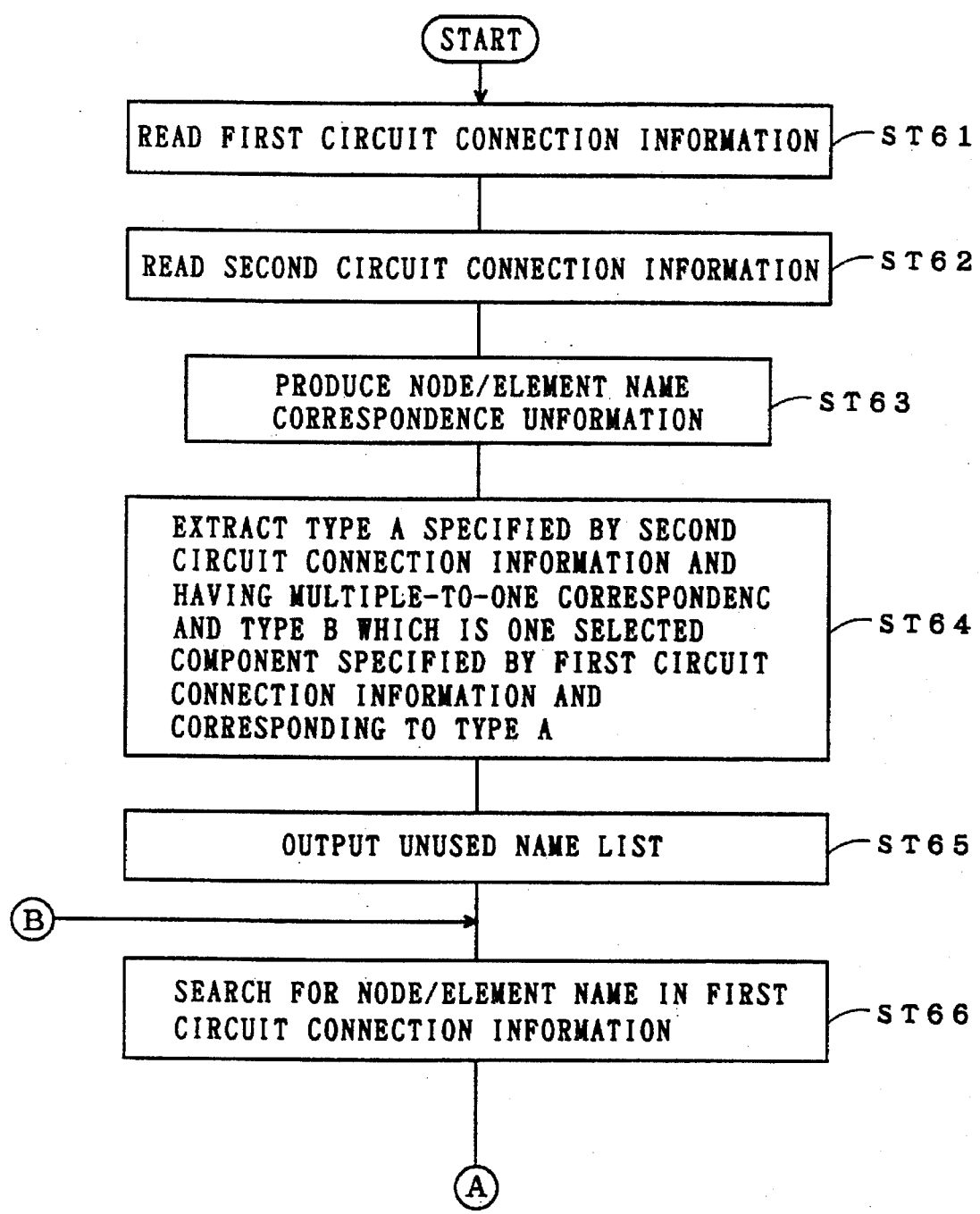
FIGS. 9 and 10 are flowcharts illustrating the operation of the circuit connection information generating device of the fourth preferred embodiment.
Figure 10:
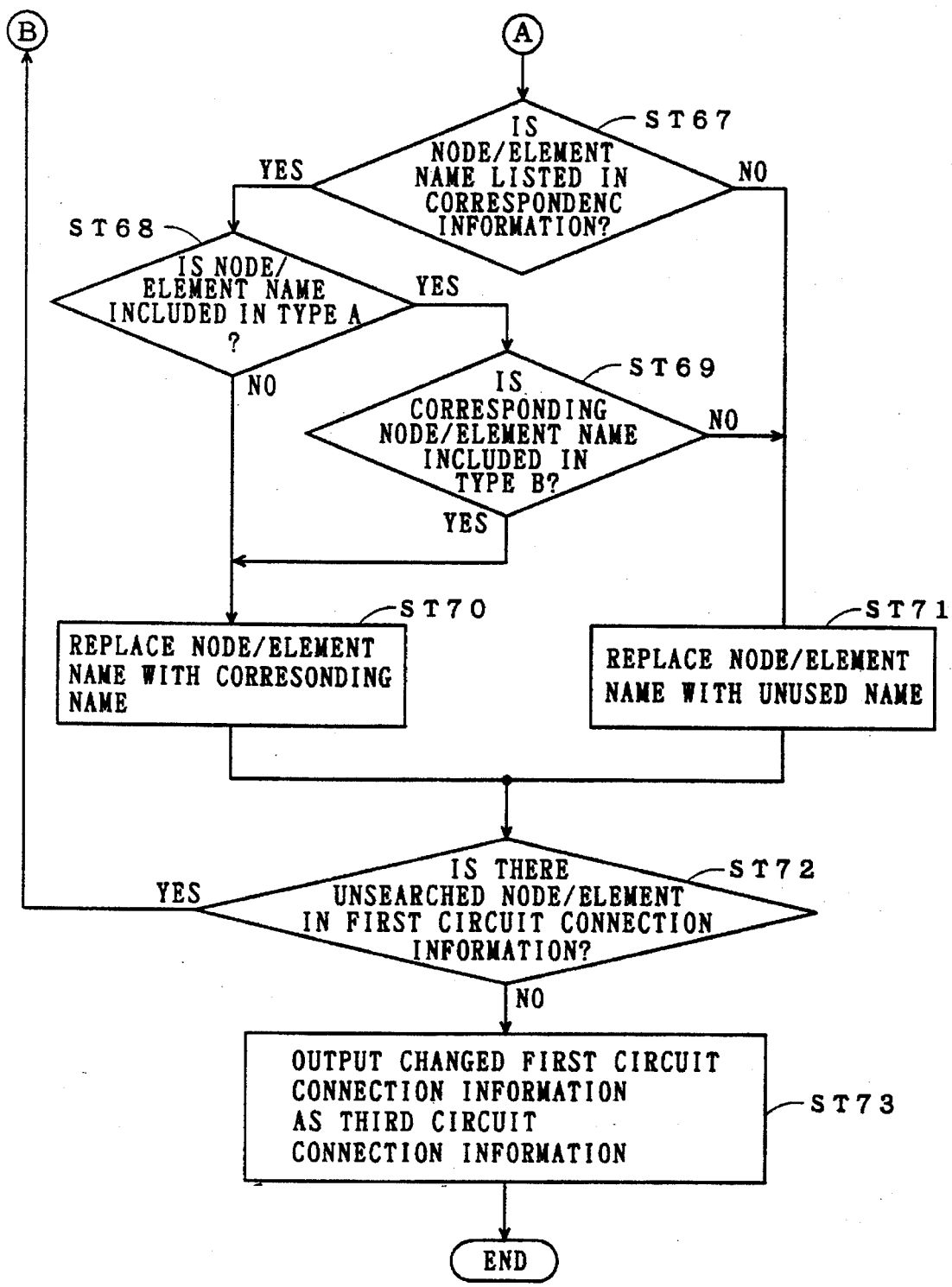

FIGS. 9 and 10 are flowcharts illustrating a generating method by the circuit connection information generating device of the fourth preferred embodiment. The generating method will be described below with reference to FIGS. 9 and 10.

In the step ST61, the first circuit connection information read means 2 reads the first circuit connection information D11. In the step ST62, the second circuit connection information read means 5 reads the second circuit connection information D12.

In the step ST63, the circuit information comparing means 6 produces the node/element name correspondence information D2 on the basis of the first circuit connection information D11 and the second circuit connection information D12 to output the node/element name correspondence information D2 to the unused name generating means 7, the multiple correspondence associated component extracting means 11, and the node/element name converting means 12.

In the step ST64, the multiple correspondence associated component extracting means 11, in the same manner as the multiple correspondence associated component extracting means 11 of the third preferred embodiment, extracts, as the multiple correspondence component (type A), the node or element specified by the second circuit connection information D12 and having the corresponding relation (multiple-to-one correspondence) with the plurality of nodes or elements and also extracts, as the selected component (type B), one of the plurality of components specified by the first circuit connection information D11 and corresponding to the component of the type A, on the basis of the node/element name correspondence information D2, to output the multiple correspondence associated component information D4 to the node/element name convening means 12.

In the step ST65, the unused name generating means 7 outputs the unused name list NL containing the names unused in the second circuit connection information D12 to the node/element name convening means 12 on the basis of the node/element name correspondence information D2.

The node/element name convening means 12 searches the node/element name correspondence information D2 for the node/element name in the read line in the first circuit connection information D11 in the step ST66, and makes a YES/NO judgement as to whether or not the read node/element name is listed in the node/element name correspondence information D2 in the step ST67. If the judgement is YES in the step ST67, the method proceeds to the step ST68. If the judgement is NO, the method proceeds to the step ST71.

In the step ST68, the node/element name converting means 12 makes a YES/NO judgement as to whether or not the read node/element name fits the multiple correspondence component (type A). If the judgement is YES, the method proceeds to the step ST69. If the judgement is NO, the method proceeds to the step ST70.

In the step ST69, the node/element name converting means 12 makes a YES/NO judgement as to whether or not the node/element name specified by the first circuit connection information and corresponding to the multiple correspondence component fits the selected component (type B). If the judgement is YES, the method proceeds to the step ST70. If the judgement is NO, the method proceeds to the step ST71.

In the step ST70, the node/element name converting means 12 replaces the node/element name in the first circuit connection information D11 with the node/element name in the second circuit connection information D12 on the basis of the node/element name correspondence information D2, and proceeds to the step ST72.

On the other hand, in the step ST71, the node/element name converting means 12 replaces the node/element name in the first circuit connection information D11 with a new name given from the unused name list NL produced by the unused name generating means 3, and then proceeds to the step ST72.

The steps ST66 to ST71 are repeated until it is judged in the step ST72 that there is no unsearched node/element name in the first circuit connection information D11.

Finally, in the step ST73, the node/element name converting means 12 outputs the first circuit connection information D11 which is subjected to the node/element name changes in the steps ST66 to ST71 as the third circuit connection information D13.

In this manner, the circuit connection information generating device of the fourth preferred embodiment outputs the third circuit connection information D13 provided by automatically adding the parasitic elements specified by the first circuit connection information D11 and the connection information thereof, while replacing the contents of the first circuit connection information D11 with the contents of the second circuit connection information D12, on the basis of the first circuit connection information D11 and the second circuit connection information D12. Therefore, the circuit connection information generating device can generate the circuit connection information which correctly reflects the circuit connection information given from the circuit drawing and which contains the parasitic elements.

In addition, when the multiple correspondence component is listed in the node/element name correspondence information D2, the multiple correspondence associated component extracting means 11 takes one of the plurality of components corresponding to the multiple correspondence component as the selected component. Further, if the condition 1 is satisfied, the node/element name converting means 12 replaces the name of the component to be converted with the name of the element and node specified by the second circuit connection information D12 on the basis of the corresponding relation in the node/element name correspondence information D2. If the condition 1 is not satisfied, the node/element name converting means 12 replaces the name of the component to be converted with the name provided by sequentially adopting from the unused name list NL. Then the node/element name converting means 12 provides the third circuit connection information D13.

As a result, the node in the first circuit connection information D11 is correctly reflected on the circuit specified by the second circuit connection information D12 in the absence of the node (element) in the circuit specified by the second circuit connection information D12 corresponding to the node (element) in the circuit specified by the first circuit connection information D11. The third circuit connection information D13 becomes more correct.

Further, like the second preferred embodiment, the circuit connection information generating device of the fourth preferred embodiment provides the node/element name correspondence information D2 (corresponding to the node/element name correspondence table D1 of the first preferred embodiment) indicative of the corresponding relation between the first circuit connection information D11 and the second circuit connection information D12 only by reading the first circuit connection information D11 and the second circuit connection information D12, thereby producing the third circuit connection information D13. Required information is only the first circuit connection information D11 and the second circuit connection information D12, and there is no need to previously provide the node/element name correspondence table D1 of the first preferred embodiment.

Further, the circuit connection information generating device of the fourth preferred embodiment produces therein the node/element name correspondence information D2 in consideration for the circuit portion including logically identical but physically different transistor connections, like the first to third preferred embodiments, to correctly apply the parasitic elements extracted from the layout pattern data to the circuit drawing in the logically identical but physically different circuit portion.

Fifth Preferred Embodiment

Figure 11:
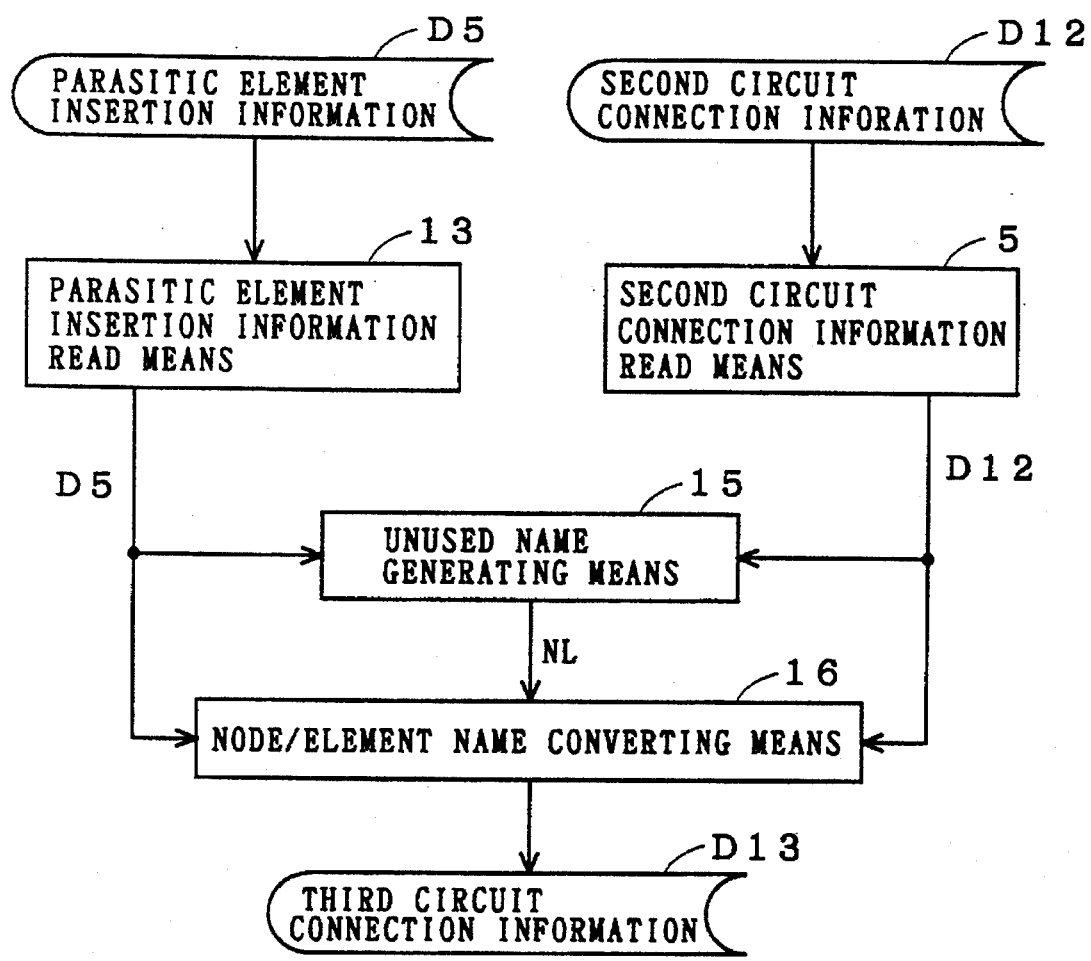
FIG. 11 is a block diagram of the circuit connection information generating device according to a fifth preferred embodiment of the present invention.

FIG. 11 is a block diagram of the circuit connection information generating device according to a fifth preferred embodiment of the present invention. Referring to FIG. 11, a parasitic element insertion information read means 13 reads parasitic element insertion information D5, and the second circuit connection information read means 5 reads the second circuit connection information D12. The second circuit connection information D12 is provided by a second circuit connection information providing means (not shown)

on the basis of the circuit drawing of a predetermined semiconductor integrated circuit.

The parasitic element insertion information D5 associates the parasitic elements to be inserted which are specified by the first circuit connection information with the nodes specified by the second circuit connection information D12.

The second circuit connection information D12 read by the second circuit connection information read means 5 is received by an unused name generating means 15 and a node/element name converting means 16.

The parasitic element insertion information D5 read by the parasitic element insertion information read means 13 is received by the unused name generating means 15 and the node/element name converting means 16.

The unused name generating means 15 outputs the unused name list NL containing names unused in the second circuit connection information D12 to the node/element name converting means 16 on the basis of the parasitic element insertion information D5 and the second circuit connection information D12.

The node/element name converting means 16 inserts a parasitic element into the node specified by the second circuit connection information D12 and generates a new node, if required to, by using a name sequentially adopted from the unused name list NL, to output the second circuit connection information D12 into which the parasitic element is inserted as the third circuit connection information D13 on the basis of the parasitic element insertion information D5, the second circuit connection information D12 and the unused name list NL.

Figure 12:
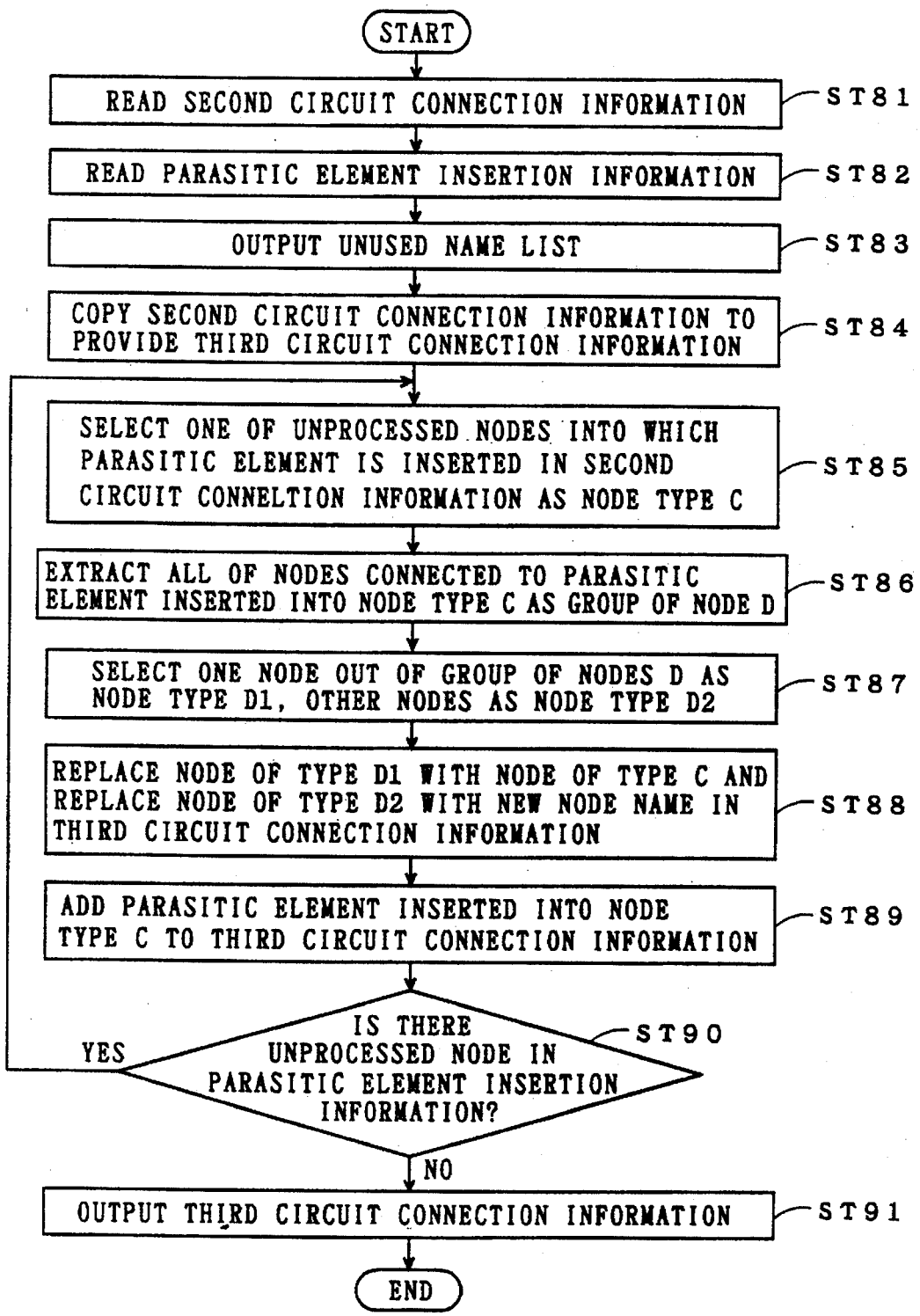
FIG. 12 is a flowchart illustrating the operation of the circuit connection information generating device of the fifth preferred embodiment.

FIG. 12 is a flowchart illustrating a generating method by the circuit connection information generating device of the fifth preferred embodiment. The generating method will be described below with reference to FIG. 12.

In the step ST81, the second circuit connection information read means 5 reads the second circuit connection information D12. In the step ST82, the parasitic element insertion information read means 13 reads the parasitic element insertion information D5.

The parasitic element insertion information D5 illustrated in FIG. 23 is provided, for instance, when the second circuit connection information D12 specifies the circuit of FIG. 20 and the first circuit connection information D11 specifies the circuit of FIG. 21.

Referring to FIG. 23, the first line indicates that a 1 Ω parasitic resistance R01 is inserted between the drain of the PMOS transistor MP01 (NMOS transistor MN01) and a node N12-1 in the node N12 of the circuit specified by the second circuit connection information D12. The second line indicates that a 1 Ω parasitic resistance R02 is inserted between the node N12-1 and the gate of the PMOS transistor MP02. The third line indicates that a 1 Ω parasitic resistance R03 is inserted between the node N12-1 and the gate of the NMOS transistor MN02.

Referring again to FIG. 12, the unused name generating means 15 outputs the unused name list NL containing the names unused in the second circuit connection information D12 to the node/element name converting means 16 on the basis of the parasitic element insertion information D5 and the second circuit connection information D12 in the step ST83.

In the step ST84, the node/element name converting means 16 copies the second circuit connection information D12 to provide the third circuit connection information D13.

In the step ST85, the node/element name converting means 16 selects one of the unprocessed nodes into which a parasitic element is to be inserted in the circuit specified by the second circuit connection information D12 on the basis of the parasitic element insertion information D5 and the second circuit connection information D12, and then takes the selected one node as a node type C.

In the step ST86, the node/element name converting means 16 extracts all of the nodes connected to the parasitic element inserted into the node of the node type C and takes these nodes as a group of nodes D.

For instance, in the example of FIGS. 20, 21 and 23, when the node N12 is of the node type C, the group of nodes D are the drain of the PMOS transistor MP01 (the NMOS transistor MN01), the node N12-1, the gate of the PMOS transistor MP02, and the gate of the NMOS transistor MN02.

In the step ST87, the node/element name converting means 16 selects one node out of the group of nodes D as a node type D1, the other nodes as a node type D2.

In the above described example, when the drain of the PMOS transistor MP01 (the NMOS transistor MN01) in the group of nodes D is selected as the node type D1, the node N12-1, the gate of the PMOS transistor MP02, and the gate of the NMOS transistor MN02 are of the node type D2.

In the step ST88, the node/element name converting means 16 replaces the node of the type D1 with the node of the type C and replaces the node of the type D2 with a new name given by sequentially adopting from the unused name list NL in the third circuit connection information D13.

In the above described example, the drain of the PMOS transistor MP01 of the type D1 is replaced with the node N12 of the type C, and the node N12-1, the gate of the PMOS transistor MP02, and the gate of the NMOS transistor MN02 which are of the type D2 are replaced respectively with new names.

In the step ST89, the node/element name converting means 16 inserts the parasitic element inserted into the node of the node type C into the third circuit connection information D13.

In the above described example, the parasitic resistances R01 to R03 are inserted into the third circuit connection information D13 such that they are arranged as shown in FIG. 21.

In the step ST90, the node/element name converting means 16 makes a YES/NO judgement as to whether or not there is an unprocessed node in the parasitic element insertion information D5. If the judgement is YES, the method returns to the step ST85. If the judgement is NO, the method proceeds to the step ST91.

The steps ST85 to ST89 are repeated until the judgement becomes NO in the step ST90.

Finally, in the step ST91, the node/element name converting means 16 outputs the third circuit connection information which is subjected to the node/element name changes in the steps ST85 to ST89.

In this manner, the circuit connection information generating device of the fifth preferred embodiment outputs the third circuit connection information D13 provided by automatically adding the parasitic elements specified by the first circuit connection information D11 and the connection information thereof directly to the second circuit connection information D12 on the basis of the parasitic element insertion information D5 and the second circuit connection information D12. Therefore, the circuit connection information generating device can generate the circuit connection information which correctly reflects the circuit connection information given from the circuit drawing and which contains the parasitic elements.

In addition, the node/element name converting means 16 inserts the parasitic element into the node specified by the second circuit connection information D12 and produces a new node, if required to, by using the name sequentially adopted from the unused name list NL on the basis of the parasitic element insertion information D5, the second circuit connection information D12, and the unused name list NL. Thus the node/element name converting means 16 correctly reflects the node in the first circuit connection information in the absence of the node in the second circuit connection information D12 corresponding to the node in the first circuit connection information during the insertion of the parasitic element. The third circuit connection information D13 becomes more correct.

Further, the circuit connection information generating device of the fifth preferred embodiment provides the second circuit connection information D12 and the parasitic element insertion information D5, thereby producing the third circuit connection information D13. There is no need to directly read the circuit connection information given from the layout pattern.

While the invention has been shown and described in detail, the foregoing description is in all aspects illustrative and not restrictive. It is therefore understood that numerous modifications and variations can be devised without departing from the scope of the invention.

What is claimed is:

1. A circuit connection information generating device comprising:

first read means for reading first associated circuit information associated with one of first circuit connection information and second circuit connection information, said first circuit connection information specifying elements and element connections provided from layout pattern data, said second circuit connection information specifying elements and element connections provided from a circuit drawing;

second read means for reading second associated circuit information associated with the other of said first circuit connection information and said second circuit connection information; and circuit connection information generating means for adding element information containing parasitic elements and connection information thereof to said second circuit connection information to automatically generate third circuit connection information on the basis of said first associated circuit information and said second associated circuit information by detecting a correspondence between said first associated circuit information and said second associated circuit information, and replacing said first associated circuit information with corresponding second circuit information when the correspondence is detected.

2. The circuit connection information generating device of claim 1, wherein said first circuit connection information and said second circuit connection information contain unique names given to respective constituent elements and respective nodes which are connecting points between the elements;

said first associated circuit information is said first circuit connection information;

said second associated circuit information is corresponding relation information in which the names of the elements and nodes specified by said second circuit connection information are listed in corresponding relation to the elements and nodes specified by said first circuit connection information; and said circuit connection information generating means includes unused name generating means for generating a group of names unused in said first circuit connection information and said second circuit connection information on the basis of said corresponding relation information, and node and element name converting means receiving said group of unused names, said first circuit connection information, and said corresponding relation information, said node and element name converting means replacing the name of a component to be converted which is each element or node specified by said first circuit connection information with the name of an element or node specified by said second circuit connection information on the basis of a corresponding relation of said component to be converted when the corresponding relation of said component to be converted is indicated in said corresponding relation information, said node and element name converting means replacing the name of said component to be converted with a name sequentially given from said group of unused names when the corresponding relation of said component to be converted is not indicated in said corresponding relation information, said node and element name converting means thereby outputting said third circuit connection information.

3. The circuit connection information generating device of claim 2, further comprising:

first circuit connection information providing means for providing said first circuit connection information on the basis of the layout pattern data of a predetermined semiconductor integrated circuit.

4. The circuit connection information generating device of claim 2, wherein said circuit connection information generating means further includes multiple correspondence associated component extracting means for extracting a multiple correspondence component which is a node or element specified by said second circuit connection information and having a corresponding relation with a plurality of nodes or elements and extracting a selected component which is one of a plurality of components specified by said first circuit connection information and corresponding to said multiple correspondence component to output multiple correspondence associated component information on the basis of said corresponding relation information, and wherein said node and element name converting means receives said group of unused names, said first circuit connection information, said corresponding relation information, and said multiple correspondence associated component information, and replaces the name of a component to be converted which is each element or node specified by said first circuit connection information with the name of an element or node specified by said second circuit connection information on the basis of a corresponding relation of said component to be converted when the following condition 1 is satisfied:

the condition 1: either a condition 1A or a condition 1B is satisfied, the condition 1A: the corresponding relation of said component to be converted is indicated in said corresponding relation information but does not contain said multiple correspondence component, the condition 1B: the corresponding relation of said component to be converted is indicated in said corresponding relation information and both said multiple correspondence component and said selected component establish the corresponding relation, and replaces the name of said component to be converted with a name sequentially given from said group of unused names when the condition 1 is not satisfied, to thereby output said third circuit connection information.

5. The circuit connection information generating device of claim 4, further comprising:

first circuit connection information providing means for providing said first circuit connection information on the basis of the layout pattern data of a predetermined semiconductor integrated circuit.

6. The circuit connection information generating device of claim 1, wherein said first circuit connection information and said second circuit connection information contain unique names given to respective constituent elements and respective nodes which are connecting points thereof;

said first associated circuit information is said first circuit connection information;

said second associated circuit information is said second circuit connection information; and said circuit connection information generating means includes circuit information comparing means for comparing said first circuit connection information and said second circuit connection information with each other to generate corresponding relation information in which the names of the elements and nodes specified by said first circuit connection information are listed in corresponding relation to the elements and nodes specified by said second circuit connection information, unused name generating means for generating a group of names unused in said first circuit connection information and said second circuit connection information on the basis of said corresponding relation information, and node and element name converting means receiving said group of unused names, said first circuit connection information, and said corresponding relation information, said node and element name converting means replacing the name of a component to be converted which is each element or node specified by said first circuit connection information with the name of an element or node specified by said second circuit connection information on the basis of a corresponding relation of said component to be converted when the corresponding relation of said component to be converted is indicated in said corresponding relation information, said node and element name converting means replacing the name of said component to be converted with a name sequentially given from said group of unused names when the corresponding relation of said component to be converted is not indicated in said corresponding relation information, said node and element name converting means thereby outputting said third circuit connection information.

7. The circuit connection information generating device of claim 6, further comprising:

first circuit connection information providing means for providing said first circuit connection information on the basis of the layout pattern data of a predetermined semiconductor integrated circuit; and second circuit connection information providing means for providing said second circuit connection information on the basis of the circuit drawing of said predetermined semiconductor integrated circuit.

8. The circuit connection information generating device of claim 6, wherein said circuit connection information generating means further includes multiple correspondence associated component extracting means for extracting a multiple correspondence component which is a node or element specified by said second circuit connection information and having a corresponding relation with a plurality of nodes or elements and extracting a selected component which is one of a plurality of components specified by said first circuit connection information and corresponding to said multiple correspondence component to output multiple correspondence associated component information on the basis of said corresponding relation information, and wherein said node and element name convening means receives said group of unused names, said first circuit connection information, said corresponding relation information, and said multiple correspondence associated component information, and replaces the name of a component to be convened which is each element or node specified by said first circuit connection information with the name of an element or node specified by said second circuit connection information on the basis of a corresponding relation of said component to be convened when the following condition 1 is satisfied:

the condition 1: either a condition 1A or a condition 1B is satisfied, the condition 1A: the corresponding relation of said component to be converted is indicated in said corresponding relation information but does not contain said multiple correspondence component, the condition 1B: the corresponding relation of said component to be converted is indicated in said corresponding relation information and both said multiple correspondence component and said selected component establish said corresponding relation, and replaces the name of said component to be converted with a name sequentially given from said group of unused names when the condition 1 is not satisfied, to thereby output said third circuit connection information.

9. The circuit connection information generating device of claim 8, further comprising:

first circuit connection information providing means for providing said first circuit connection information on the basis of the layout pattern data of a predetermined semiconductor integrated circuit; and second circuit connection information providing means for providing said second circuit connection information on the basis of the circuit drawing of said predetermined semiconductor integrated circuit.

10. The circuit connection information generating device of claim 1, wherein said second circuit connection information contains unique names given to respective constituent elements and respective nodes which are connecting points thereof;

said first associated circuit information is parasitic element insertion information in which nodes specified by said second circuit connection information are associated with parasitic elements specified by said first circuit connection information and to be inserted into the nodes;

said second associated circuit information is said second circuit connection information; and said circuit connection information generating means includes unused name generating means for generating a group of names unused in said second circuit connection information on the basis of said second circuit connection information, and node and element name converting means for inserting a parasitic element into a node specified by said second circuit connection information while generating a new node, if required to, using a name sequentially given from said group of unused names to add said element information containing the parasitic elements and said connection information thereof to said second circuit connection information, thereby to output said third circuit connection information on the basis of said group of unused names, said second circuit connection information, and said parasitic element insertion information.

11. The circuit connection information generating device of claim 10, further comprising:

second circuit connection information providing means for providing said second circuit connection information on the basis of the circuit drawing of a predetermined semiconductor integrated circuit.

12. A method of generating circuit connection information, comprising the steps of:

(a) reading first associated circuit information associated with one of first circuit connection information and second circuit connection information, said first circuit connection information specifying elements and element connections provided from layout pattern data, said second circuit connection information specifying elements and element connections provided from a circuit drawing;

(b) reading second associated circuit information associated with the other of said first circuit connection information and said second circuit connection information; and (c) adding element information containing parasitic elements and connection information thereof to said second circuit connection information to automatically generate third circuit connection information on the basis of said first associated circuit information and said second associated circuit information by detecting a correspondence between said first associated circuit information and said second associated circuit information, and replacing said first associated circuit information with corresponding second circuit information when the correspondence is detected.

13. The method of claim 12, wherein said first circuit connection information and said second circuit connection information contain unique names given to respective constituent elements and respective nodes which are connecting points thereof;

said first associated circuit information is said first circuit connection information;

said second associated circuit information is corresponding relation information in which the names of the elements and nodes specified by said second circuit connection information are listed in corresponding relation to the elements and nodes specified by said first circuit connection information; and said step (c) includes the steps of:

(c–1) generating a group of names unused in said first circuit connection information and said second circuit connection information on the basis of said corresponding relation information;

(c–2) receiving said first circuit connection information and said corresponding relation information and making a YES/NO judgement as to whether or not a corresponding relation of a component to be converted is indicated in said corresponding relation information, said component to be converted being each of the elements and nodes specified by said first circuit connection information;

(c–3) replacing the name of said component to be converted with the name of an element or node specified by said second circuit connection information on the basis of said corresponding relation information when the judgement in said step (c-2) is YES;

(c–4) replacing the name of said component to be converted with a name given from said group of unused names when the judgement in said step (c-2) is NO; and (c–5) outputting said third circuit connection information after subjected to the replacement in said steps (c-3) and (c-4).

14. The method of claim 12, wherein said first circuit connection information and said second circuit connection information contain unique names given to respective constituent elements and respective nodes which are connecting points thereof;

said first associated circuit information is said first circuit connection information;

said second associated circuit information is corresponding relation information in which the names of the elements and nodes specified by said second circuit connection information are listed in corresponding relation to the elements and nodes specified by said first circuit connection information; and said step (c) includes the steps of:

(c–1) generating a group of names unused in said first circuit connection information and said second circuit connection information on the basis of said corresponding relation information;

(c–2) extracting a multiple correspondence component which is a node or element specified by said second circuit connection information and having a corresponding relation with a plurality of nodes or elements and extracting a selected component which is one of a plurality of components specified by said first circuit connection information and corresponding to said multiple correspondence component to output multiple correspondence associated component information on the basis of said corresponding relation information;

(c–3) receiving said first circuit connection information and said corresponding relation information and making a YES/NO judgement as to whether or not a corresponding relation of a component to be converted is indicated in said corresponding relation information, said component to be converted being each of the elements and nodes specified by said first circuit connection information;

(c-4) when the judgement in the step (c-3) is YES, making a YES/NO judgement as to whether or not said component to be converted satisfies the following condition 2:

the condition 2: either a condition 2A or a condition 2B is satisfied, the condition 2A: the corresponding relation of said component to be converted specified by said corresponding relation information contains said multiple correspondence component, the condition 2B: both said multiple correspondence component and said selected component establish the corresponding relation of said component to be converted specified by said corresponding relation information;

(c-5) replacing the name of said component to be converted with the name of an element or node specified by said second circuit connection information on the basis of said corresponding relation information when the judgement in said step (c-4) is YES;

(c-6) replacing the name of said component to be converted with a name given from said group of unused names when the judgement in said step (c-3) or (c-4) is NO; and (c-7) outputting said third circuit connection information after subjected to the replacement in said steps (c-5) and (c-6).

15. The method of claim 12, wherein said first circuit connection information and said second circuit connection information contain unique names given to respective constituent elements and respective nodes which are connecting points thereof;

said first associated circuit information is said first circuit connection information;

said second associated circuit information is said second circuit connection information; and said step (c) includes the steps of:

(c-1) comparing said first circuit connection information and said second circuit connection information with each other to generate corresponding relation information in which the names of the elements and nodes specified by said first circuit connection information are listed in corresponding relation to the elements and nodes specified by said second circuit connection information;

(c-2) generating a group of names unused in said first circuit connection information and said second circuit connection information on the basis of said corresponding relation information;

(c-3) receiving said group of unused names, said first circuit connection information and said corresponding relation information and making a YES/NO judgement as to whether or not a corresponding relation of a component to be converted is indicated in said corresponding relation information, said component to be converted being each of the elements and nodes specified by said first circuit connection information;

(c-4) replacing the name of said component to be converted with the name of an element or node specified by said second circuit connection information on the basis of said corresponding relation information when the judgement in said step (c-3) is YES;

(c-5) replacing the name of said component to be converted with a name given from said group of unused names when the judgement in said step (c-3) is NO; and (c-6) outputting said third circuit connection information after subjected to the replacement in said steps (c-4) and (c-5).

16. The method of claim 12, wherein said first circuit connection information and said second circuit connection information contain unique names given to respective constituent elements and respective nodes which are connecting points thereof;

said first associated circuit information is said first circuit connection information;

said second associated circuit information is said second circuit connection information; and said step (c) includes the steps of:

(c-1) comparing said first circuit connection information and said second circuit connection information with each other to generate corresponding relation information in which the names of the elements and nodes specified by said first circuit connection information are listed in corresponding relation to the elements and nodes specified by said second circuit connection information;

(c-2) generating a group of names unused in said first circuit connection information and said second circuit connection information on the basis of said corresponding relation information;

(c-3) extracting a multiple correspondence component which is a node or element specified by said second circuit connection information and having a corresponding relation with a plurality of nodes or elements and extracting a selected component which is one of a plurality of components specified by said first circuit connection information and corresponding to said multiple correspondence component to output multiple correspondence associated component information on the basis of said corresponding relation information;

(c-4) receiving said first circuit connection information and said corresponding relation information and making a YES/NO judgement as to whether or not a corresponding relation of a component to be converted is indicated in said corresponding relation information, said component to be converted being each of the elements and nodes specified by said first circuit connection information;

(c-5) when the judgement in the step (c-4) is YES, making a YES/NO judgement as to whether or not said component to be converted satisfies the following condition 2:

the condition 2: either a condition 2A or a condition 2B is satisfied, the condition 2A: the corresponding relation of said component to be converted specified by said corresponding relation information contains said multiple correspondence component, the condition 2B: both said multiple correspondence component and said selected component establish the corresponding relation of said component to be converted specified by said corresponding relation information;

(c-6) replacing the name of said component to be converted with the name of an element or node specified by said second circuit connection information on the basis of said corresponding relation information when the judgement in said step (c-5) is YES;

(c-7) replacing the name of said component to be converted with a name given from said group of unused names when the judgement in said step (c-4) or (c-5) is NO; and (c–8) outputting said third circuit connection information after subjected to the replacement in said steps (c-6) and (c-7).

17. The method of claim 12, wherein said second circuit connection information contains unique names given to respective constituent elements and respective nodes which are connecting points thereof;

said first associated circuit information is parasitic element insertion information in which nodes specified by said second circuit connection information are associated with parasitic elements specified by said first circuit connection information and to be inserted into said nodes;

said second associated circuit information is said second circuit connection information; and said step (c) includes the steps of:

(c–1) generating a group of names unused in said second circuit connection information on the basis of said second circuit connection information; and (c–2) inserting a parasitic element into a node specified by said second circuit connection information while generating a new node, if required to, using a name sequentially given from said group of unused names to add said element information containing the parasitic elements and said connection information thereof to said second circuit connection information, thereby to output said third circuit connection information on the basis of said group of unused names, said second circuit connection information, and said parasitic element insertion information.

* * * * *